United States Patent
Koshihara

(10) Patent No.: US 9,947,890 B2
(45) Date of Patent: Apr. 17, 2018

(54) ELECTRO-OPTICAL DEVICE AND ELECTRONIC APPARATUS

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/425,657

(22) Filed: Feb. 6, 2017

(65) Prior Publication Data
US 2017/0237032 A1    Aug. 17, 2017

(30) Foreign Application Priority Data

Feb. 15, 2016    (JP) .................................. 2016-026011

(51) Int. Cl.
*H01L 51/52*    (2006.01)
*H01L 27/32*    (2006.01)

(52) U.S. Cl.
CPC ........ *H01L 51/524* (2013.01); *H01L 27/3218* (2013.01); *H01L 51/5246* (2013.01); *H01L 51/5253* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 2003/0128178 A1* | 7/2003 | Murade | G02F 1/136227 345/87 |
| 2004/0061434 A1 | 4/2004 | Mori et al. | |
| 2006/0215068 A1* | 9/2006 | Nakagawa | G02F 1/136213 349/38 |
| 2010/0067235 A1* | 3/2010 | Yamashita | G02F 1/133305 362/293 |
| 2013/0128178 A1* | 5/2013 | Kuo | G02F 1/133608 349/58 |
| 2014/0117334 A1* | 5/2014 | Nakamura | H01L 27/322 257/40 |
| 2014/0361273 A1* | 12/2014 | Nozawa | H01L 51/524 257/40 |

(Continued)

FOREIGN PATENT DOCUMENTS

| | | |
|---|---|---|
| JP | 2006-066364 A | 3/2006 |
| JP | 2006-134825 A | 5/2006 |

(Continued)

*Primary Examiner* — Bilkis Jahan
(74) *Attorney, Agent, or Firm* — Oliff PLC

(57) ABSTRACT

An electro-optical device includes an element substrate that includes a display region in which a plurality of light emitting elements are arranged in matrix form and a terminal region in which mounting terminals are arranged on an outer side of the display region, a protective substrate that faces a plurality of light emitting element side of the element substrate, and a joining substrate that is joined to the terminal region of the element substrate, and includes a connection terminal. A sealing film, which seals the plurality of light emitting elements, is also formed in the terminal region on the element substrate. The mounting terminal is connected to the connection terminal. Portions in which the sealing film is removed, and which join to the joining substrate in the electro-optical device are present.

16 Claims, 19 Drawing Sheets

(56) References Cited

U.S. PATENT DOCUMENTS

2016/0109504 A1 4/2016 Shang et al.
2016/0190520 A1 6/2016 Koshihara

FOREIGN PATENT DOCUMENTS

| JP | 2006-185593 A | 7/2006 |
| JP | 2007-073353 A | 3/2007 |
| JP | 2007-234610 A | 9/2007 |
| JP | 2014-089803 A | 5/2014 |
| JP | 2014-235958 A | 12/2014 |
| JP | 2016-122138 A | 7/2016 |
| JP | 2016-122612 A | 7/2016 |
| JP | 2016-122614 A | 7/2016 |

* cited by examiner

E2

ELECTRO-OPTICAL DEVICE AND ELECTRONIC APPARATUS

BACKGROUND

1. Technical Field

The present invention relates to an electro-optical device and an electronic apparatus.

2. Related Art

An organic EL device in which pixels that use organic Electro Luminescence (EL) elements are arranged in a display region of an element substrate in matrix form has been proposed as an example of an electro-optical device (for example, refer to JP-A-2014-089803).

More specifically, JP-A-2014-089803 discloses an organic EL device having a top emission structure, which includes organic EL elements in which a reflective layer, a first electrode (a pixel electrode), a light-emitting layer, and a second electrode (an opposing electrode) are sequentially stacked.

Incidentally, in the organic EL device disclosed in JP-A-2014-089803, a plurality of terminals, which include a mounting terminal for mounting a data line driving circuit, a scanning line driving circuit, and the like, and a terminal for external connection, and the like, are arranged in a peripheral region on an outer side of a display region. These terminals have structures in which a reflective conductive material such as aluminum (Al), which is formed as a film in the same process as for the above-mentioned reflective layer, and a transparent conductive material such as indium tin oxide (ITO), which is formed as a film in the same process as for the first electrode, are stacked together.

In JP-A-2014-089803, in a structure in which a light emitting element is sealed by a sealing film, and a color filter is formed on the upper surface of the corresponding sealing film, a so-called top emission type On-chip Color Filter (OCCF) structure, etching of the sealing film on the mounting terminal is performed using a color filter or an insulation layer as a mask. In this case, if etching of a region that extends across a plurality of mounting terminals is performed excessively, there is a possibility that the side surfaces, and the like, of the mounting terminals will be etched, and that reflective electrodes (an Al film), which are in lower layers of the mounting terminals, will be exposed. On the other hand, in a case in which etching of the sealing film is performed for each mounting terminal, there are cases in which peeling occurs at an interface between the sealing film and an insulation film of the lower layer after mounting of an external connection substrate.

SUMMARY

An advantage of some aspects of the invention is to provide an electro-optical device and an electronic apparatus that can improve the joining strength of an external connection substrate by preventing detachment from occurring at an interface between a sealing film and an insulation film of lower layer.

According to an aspect of the invention, there is provided an electro-optical device including an element substrate that includes a display region in which a plurality of light emitting elements are arranged in matrix form, and a terminal region in which a plurality of mounting terminals are arranged on an outer side of the display region, a protective substrate that faces a plurality of light emitting element side of the element substrate, and an external connection substrate that is joined to the terminal region of the element substrate, in which a sealing film, which seals the plurality of light emitting elements, is also formed in the terminal region on the element substrate, at least a part of each mounting terminal is exposed from the sealing film, and, among the terminal region portions, other than portions that are on the mounting terminals, there are portions without the sealing film in regions that face the external connection substrate.

In this case, it is possible to improve the mounting strength of the external connection substrate in portions without the sealing film in the terminal region. As a result of this, it is possible to ensure that the external connection substrate remains joined to the element substrate for a long period of time.

In addition, in the electro-optical device, the portions without the sealing film may be present between the plurality of mounting terminals.

In this case, it is possible to improve the joining strength of the external connection substrate as a result of eliminating the sealing film of portions that contribute to the joining of the external connection substrate (between the mounting terminals).

In addition, in the electro-optical device, the portions without the sealing film may be present on a display region side of the mounting terminals.

In this case, it is possible to improve the joining strength of the external connection substrate even if the portions without the sealing film are on a display region side of the mounting terminals.

In addition, in the electro-optical device, at least a part of an interlayer insulation film, which is provided more toward a lower layer side than the sealing film, may be exposed in the portions without the sealing film.

In this case, it is possible to increase the surface area of an element substrate side with respect to adhesive when joining the external connection substrate by exposing a part of the interlayer insulation film.

According to another aspect of the invention, there is provided an electronic apparatus including the electro-optical device.

In this case, as a result of being provided with an electro-optical device in which the joining strength of the element substrate and the external connection substrate is high, it is possible to maintain the quality of the electronic apparatus for a long period of time.

According to still another aspect of the invention, there is provided a manufacturing method of an electro-optical device, the method including: forming a plurality of light emitting elements in a display region of an element substrate; forming a plurality of mounting terminals in a terminal region that is on an outer side of the display region of the element substrate; forming a sealing film so as to cover the plurality of light emitting elements and the plurality of mounting terminals; removing the sealing film on the mounting terminals; and, among the sealing film portions that are in the terminal region, removing the sealing film portions other than portions that are on the mounting terminals.

In addition, the manufacturing method of an electro-optical device may further include connecting the external connection substrate to the element substrate, and in the removing of the sealing film, among the terminal region portions, a predetermined portion of the sealing film may be removed in order to form a portion in which the sealing film is not present in a region that faces the external connection substrate.

In addition, in the manufacturing method of an electro-optical device, in the terminal region, among the regions that face the external connection substrate, a predetermined portion of the sealing film may be removed in order to form portion in which the sealing film is not present on the display region side of the mounting terminals.

In addition, in the manufacturing method of an electro-optical device, at least a part of an interlayer insulation film, which is provided more toward a lower layer side than the sealing film, may be exposed in the removing of the sealing film.

In addition, the manufacturing method of an electro-optical device may further include the forming of color filters in the display region, the forming of a resist pattern in the terminal region using the same material as that for the color filters, or the same material as that of an insulation layer that partitions the color filters, and removal of the sealing film using the corresponding resist pattern as a mask.

BRIEF DESCRIPTION OF THE DRAWINGS

The invention will be described with reference to the accompanying drawings, wherein like numbers reference like elements.

DESCRIPTION OF EXEMPLARY EMBODIMENTS

Organic EL Device

Figure 1:
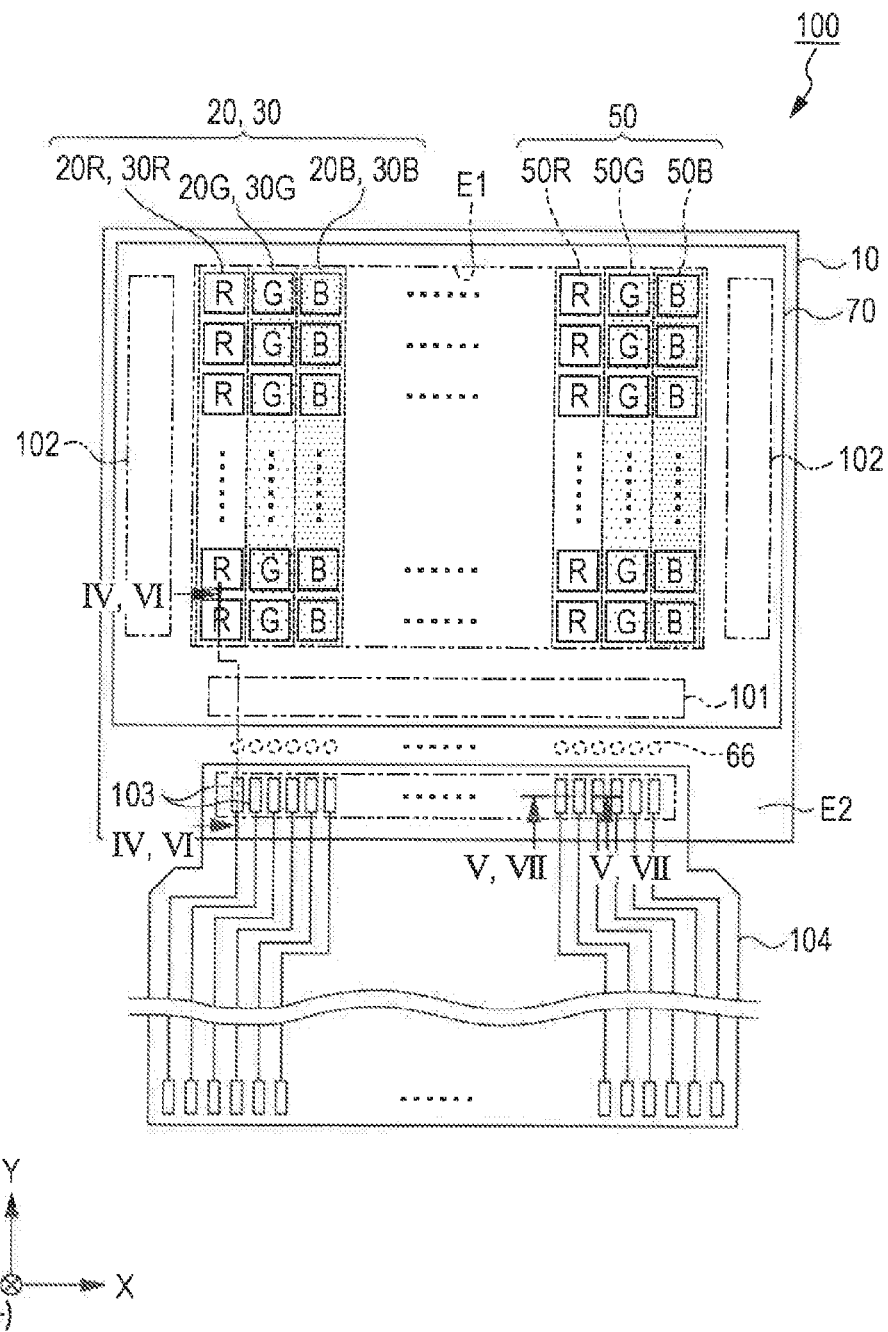
FIG. 1 is a plan view that schematically shows a configuration of an organic EL device.

Firstly, an organic EL device (an electro-optical device) 100 that is shown in FIG. 1 as an embodiment of the invention will be described.

The organic EL device 100 is a light-emitting type display device that is shown as an example of an "electro-optical device" in the present embodiment. Additionally, FIG. 1 is a plan view that schematically shows a configuration of the organic EL device 100.

As shown in FIG. 1, the organic EL device 100 includes an element substrate 10, and a substrate for sealing (a protective substrate) 70. The element substrate 10 and the substrate for sealing 70 are joined using an adhesive, illustration of which is omitted from the drawings, in a state of mutually facing one another. Additionally, for example, it is possible to use an epoxy resin, an acrylic resin, or the like as the adhesive.

The element substrate 10 includes, arranged in matrix form, a display region E1 in which sub pixels 20B, in which organic EL elements (light emitting elements) 30B, that emit blue (B) light are disposed, sub pixels 20G, in which organic EL elements 30G that emit green (G) light are disposed, and sub pixels 20R, in which organic EL elements 30R that emit red (R) light are disposed.

In the organic EL device 100, a full-color display is provided with the sub pixels 20B, the sub pixels 20G, and the sub pixels 20R as display units. Additionally, in the description from this point onwards, there are cases in which the sub pixels 20B, the sub pixels 20G, and the sub pixels 20R are collectively treated as pixels 20, and there are cases in which the organic EL elements 30B, the organic EL elements 30G, and the organic EL elements 30R are collectively treated as organic EL elements 30.

Color filters 50 are provided in the display region E1. Among the color filters 50, blue colored layers 50B are disposed on the organic EL elements 30B of the sub pixels 20B, green colored layers 50G are disposed on the organic EL elements 30G of the sub pixels 20G, and red colored layers 50R are disposed on the organic EL elements 30R of the sub pixels 20R. Light that is emitted from the organic EL elements 30B of the sub pixels 20B is transmitted by the blue colored layers 50B and blocked by the green colored layers 50G and the red colored layers 50R. In the same manner, light that is emitted from the organic EL elements 30G of the sub pixels 20G is transmitted by the green colored layers 50G and blocked by the blue colored layers 50B and the red colored layers 50R, and light that is emitted from the organic EL elements 30R of the sub pixels 20R is transmitted by the red colored layers 50R and blocked by the blue colored layers 50B and the green colored layers 50G. Accordingly, the direction of light that is emitted from the organic EL device 100 is defined by the position of each organic EL element 30 and the position of each colored layer of the color filters 50.

In the present embodiment, pixels 20 from which emitted light of the same color is obtained, are arranged in a Y direction (a first direction), and pixels 20 from which emitted light of different colors is obtained, are arranged in an X direction (a second direction), which intersects (is orthogonal to) the Y direction. Accordingly, the positions of the pixels 20 form a so-called striped system. The organic EL elements 30B, the organic EL elements 30G, and the organic EL elements 30R are respectively disposed in a striped form in accordance with the arrangement of the pixels, and the blue colored layers 50B, the green colored layers 50G, and the red colored layers 50R are also arranged in a striped form. Additionally, the positions of the pixels 20 are not limited to a striped system, and may be a mosaic system, or a delta system.

The organic EL device 100 has a top emission structure. Accordingly, light that is emitted by the organic EL elements 30 is transmitted by the color filters 50 of the element substrate 10 and ejected as display light from the side of the substrate for sealing 70.

Since the organic EL device 100 has a top emission structure, in addition to a transparent quartz substrate, glass substrate, or the like, it is possible to use an opaque ceramic substrate, a semiconductor substrate, or the like as the base material of the element substrate 10. In the present embodiment, a silicon substrate (a semiconductor substrate) is used as the base material of the element substrate 10.

A peripheral region F, in which mounting terminals 103 are arranged, is provided on an outer side of the display region E1. A plurality of the mounting terminals 103 are arranged in the peripheral region F along one edge of the long edge side of the element substrate 10. In addition, a data line driving circuit 101 is provided between the plurality of mounting terminals 103 and the display region E1. In addition, scanning line driving circuits 102 are provided between the two edges of the short edge sides of the element substrate 10 and the display region E1. Additionally, in the description from this point onwards, a direction that follows the long edges of the element substrate 10 will be referred to as the X direction, a direction that follows the short edges of the element substrate 10 will be referred to as the Y direction, and a direction that faces the element substrate 10 from the substrate for sealing 70 will be referred to as a Z (+) direction.

The substrate for sealing 70 is smaller than the element substrate 10 and is disposed facing the element substrate 10 so that the mounting terminals 103 are exposed. The substrate for sealing 70 is a translucent substrate, and it is possible to use a quartz substrate, a glass substrate, or the like. The substrate for sealing 70 has a role of protecting so that the organic EL elements 30, which are disposed in the display region E1 are not damaged, and is provided so as to be wider than the display region E1.

Figure 2:
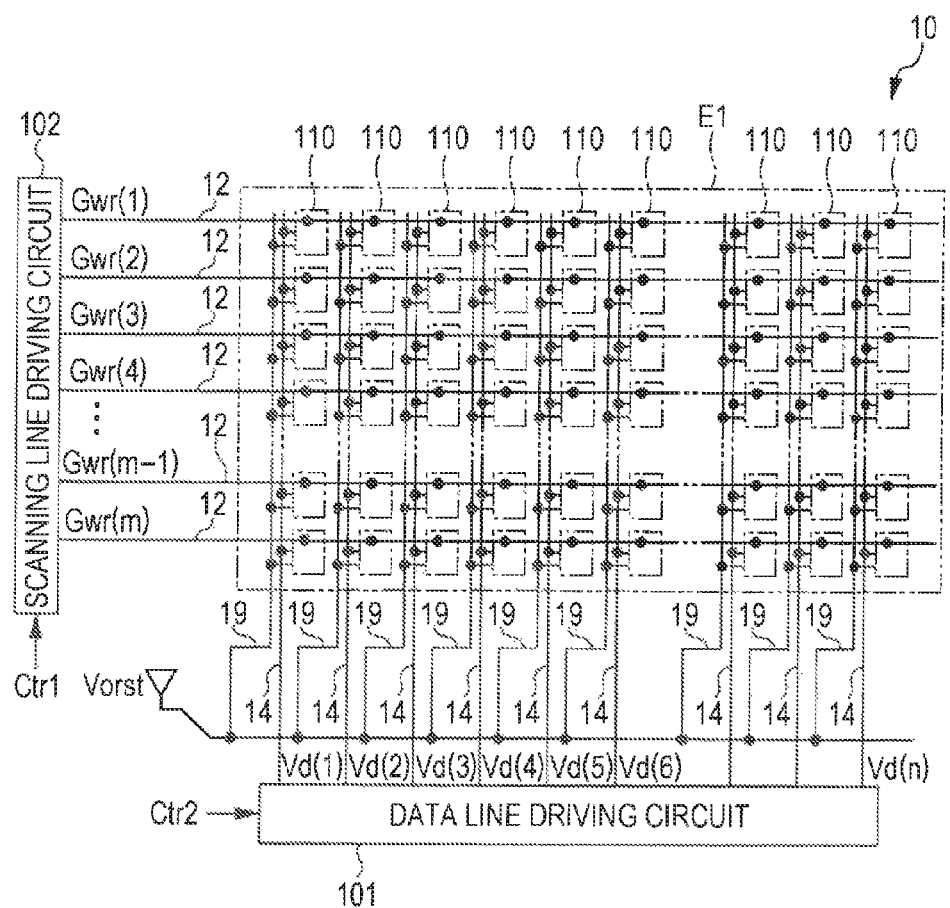
FIG. 2 is a circuit diagram that shows a configuration of an element substrate.

FIG. 2 is a circuit diagram that shows a configuration of the element substrate 10. As shown in FIG. 2, on the element substrate 10, m rows of scanning lines 12 are provided extending in the X direction, and n columns of data lines 14 are provided extending in the Y direction. In addition, power source lines 19 are provided on the element substrate 10 extending in the Y direction for each column that follows the data lines 14.

Pixel circuits 110 are provided on the element substrate 10 to correspond to intersecting sections of the m rows of scanning lines 12 and the n columns of data lines 14. Each pixel circuit 110 forms a part of a pixel 20. m rows×n columns of pixel circuits 110 are arranged in the display region E1 in matrix form.

A potential Vorst, which is a reset potential for initialization is supplied (fed) to the power source lines 19. Furthermore, although illustration thereof is omitted from the drawings, three control lines, which supply control signals Gcmp, Gel, and Gorst, are provided in parallel to the scanning lines 12.

The scanning lines 12 are electrically connected to the scanning line driving circuits 102. The data lines 14 are electrically connected to the data line driving circuit 101. A control signal Ctr1 for controlling the scanning line driving circuits 102 is supplied to the scanning line driving circuits 102. A control signal Ctr2 for controlling the data line driving circuit 101, is supplied to the data line driving circuit 101.

In accordance with the control signal Ctr1, the scanning line driving circuits 102 create scanning signals Gwr(1), Gwr(2), Gwr(3), . . . , Gwr(m−1), and Gwr(m) for scanning the scanning lines 12 one row at a time during a period of a frame. Furthermore, in addition to the scanning signals Gwr, the scanning line driving circuits 102 supply the control signals Gcmp, Gel, and Gorst to the control lines. Additionally, the period of a frame is a period in which an image corresponding to 1 cut (segment) is displayed in the organic EL device 100. For example, a period of 1 frame is equal to approximately 8.3 milliseconds if the frequency of a vertical synchronization signal, which is included in a synchronization signal, is 120 Hz.

The data line driving circuit 101 supplies data signals Vd(1), Vd(2), . . . , and Vd(n) of potentials that corresponds to grayscale data of a pixel circuit 110 that is positioned in a row that is selected by the scanning line driving circuits 102 for the corresponding pixel circuit 110, to $1^{st}$, $2^{nd}$, . . . , and $n^{th}$ columns of the data lines 14.

Figure 3:
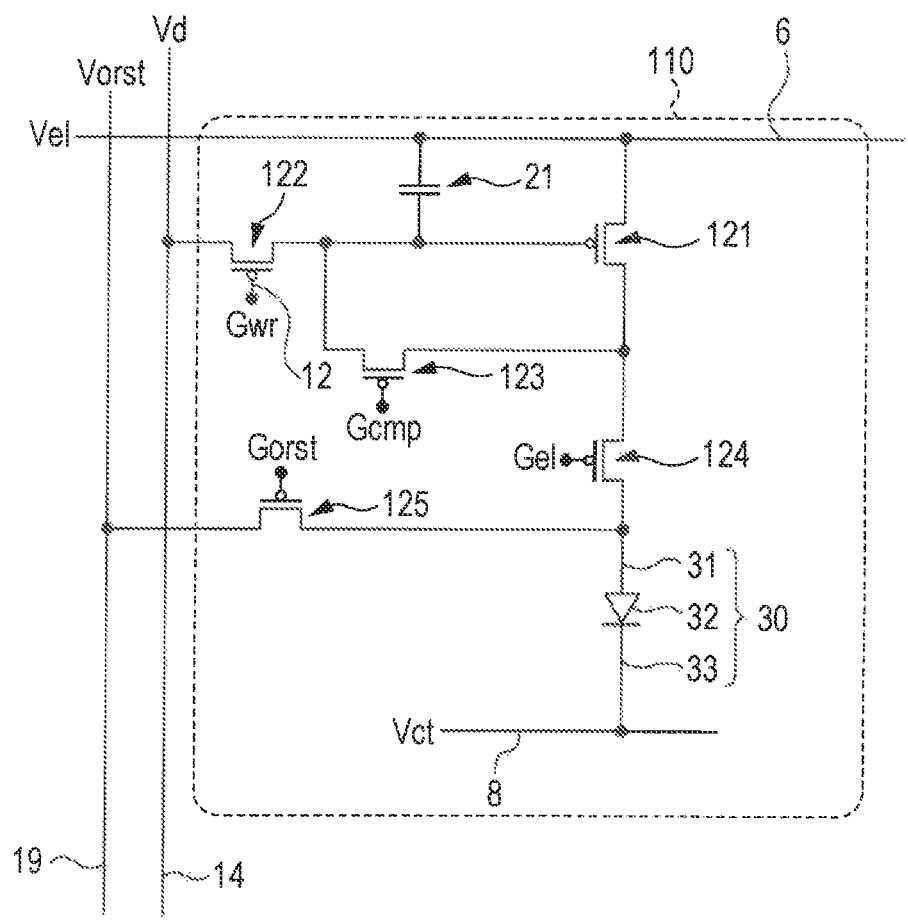
FIG. 3 is a circuit diagram that shows a configuration of a pixel circuit.

FIG. 3 is a circuit diagram that shows a configuration of a pixel circuit 110. As shown in FIG. 3, the pixel circuit 110 includes P-channel MOS-type transistors 121, 122, 123, 124, and 125, an organic EL element 30, and a capacitor 21. The above-mentioned scanning signals Gwr, control signals Gcmp, Gel, and Gorst, and the like, are supplied to the pixel circuit 110.

The organic EL element 30 has a structure in which a light-emitting functional layer (a light-emitting layer) 32 is held between a pixel electrode (a first electrode) 31 and a common electrode (a second electrode) 33, which face one another.

The pixel electrode 31 is an anode that supplies positive holes to the light-emitting functional layer 32 and is formed using a conductive material that has a light transmissive property. In the present embodiment, an indium tin oxide (ITO) film having a film thickness of 200 nm, for example, is formed as the pixel electrode 31. The pixel electrode 31 is electrically connected to the drain of the transistor 124 and to either one of the source or the drain of the transistor 125.

The common electrode 33 is a cathode that supplies electrons to the light-emitting functional layer 32 and is formed using a conductive material that has a light transmissive property and a light reflective property, such as an alloy of magnesium (Mg) and silver (Ag), for example. The common electrode 33 is a common electrode that is provided across a plurality of pixels 20 and is electrically connected to a power source line 8. A potential Vct, which acts as a low potential side of a power source in the pixel circuit 110 is supplied to the power source line 8.

The light-emitting functional layer 32 includes a hole injection layer, a hole transport layer, an organic light-emitting layer, an electron transport layer, and the like, which are stacked in order from the side of the pixel electrode 31. In the organic EL element 30, the light-emitting functional layer 32 emits light as a result of positive holes that are supplied from the pixel electrode 31 bonding with electrons that are supplied from the common electrode 33 in the light-emitting functional layer 32.

In addition, a power source line 6 is provided on the element substrate 10, extends in the X direction, and intersects each power source line 19. Additionally, the power source line 6 may be provided extending in the Y direction, or may be provided extending in both the X direction and the Y direction. In the transistor 121, the source is electrically connected to the power source line 6, and the drain is respectively electrically connected to the source of the transistor 124 and to either one of the source or the drain of the transistor 123. In addition, a potential Vel, which acts as a high potential side of a power source in the pixel circuit 110 is supplied to the power source line 6. In addition, one end of the capacitor 21 is electrically connected to the power source line 6. The transistor 121 functions as a driving transistor that induces the flow of a current that depends on the voltage between the gate and the source of the transistor 121 (T).

In the transistor 122, the gate is electrically connected to a scanning line 12, and either one of the source or the drain is electrically connected to a data line 14. In addition, in the transistor 122, the other of the source or the drain is respectively electrically connected to the gate of the transistor 121, the other end of the capacitor 21, and the other one of the source or the drain of the transistor 123. The transistor 122 is electrically connected between the gate of the transistor 121 and the data line 14 and functions as a write-in transistor that controls the electrical connection between the gate of the transistor 121 and the data line 14.

In the transistor 123, the gate is electrically connected to a control line, and the control signal Gcmp is supplied. The transistor 123 functions as a threshold value compensation transistor that controls the electrical connection between the gate and the drain of the transistor 121.

In the transistor 124, the gate is electrically connected to a control line, and the control signal Gel is supplied. In the transistor 124, the drain is respectively electrically connected to the pixel electrode 31 of the organic EL element 30 and either one of the source or the drain of the transistor 125. The transistor 124 functions as a light emission control transistor that controls the electrical connection between the drain of the transistor 121 and the pixel electrode 31 of the organic EL element 30.

In the transistor 125, the gate is electrically connected to a control line, and the control signal Gorst is supplied. In addition, the other of the source or the drain of the transistor 125 is electrically connected to a power source line 19, and the reset potential Vorst is supplied. The transistor 125 functions as an initialization transistor that controls the electrical connection between the power source line 19 and the pixel electrode 31 of the organic EL element 30.

Additionally, in the following description, there are also cases in which the transistors 122, 123, 124, and 125 are simply referred to as transistors T.

Figure 4:
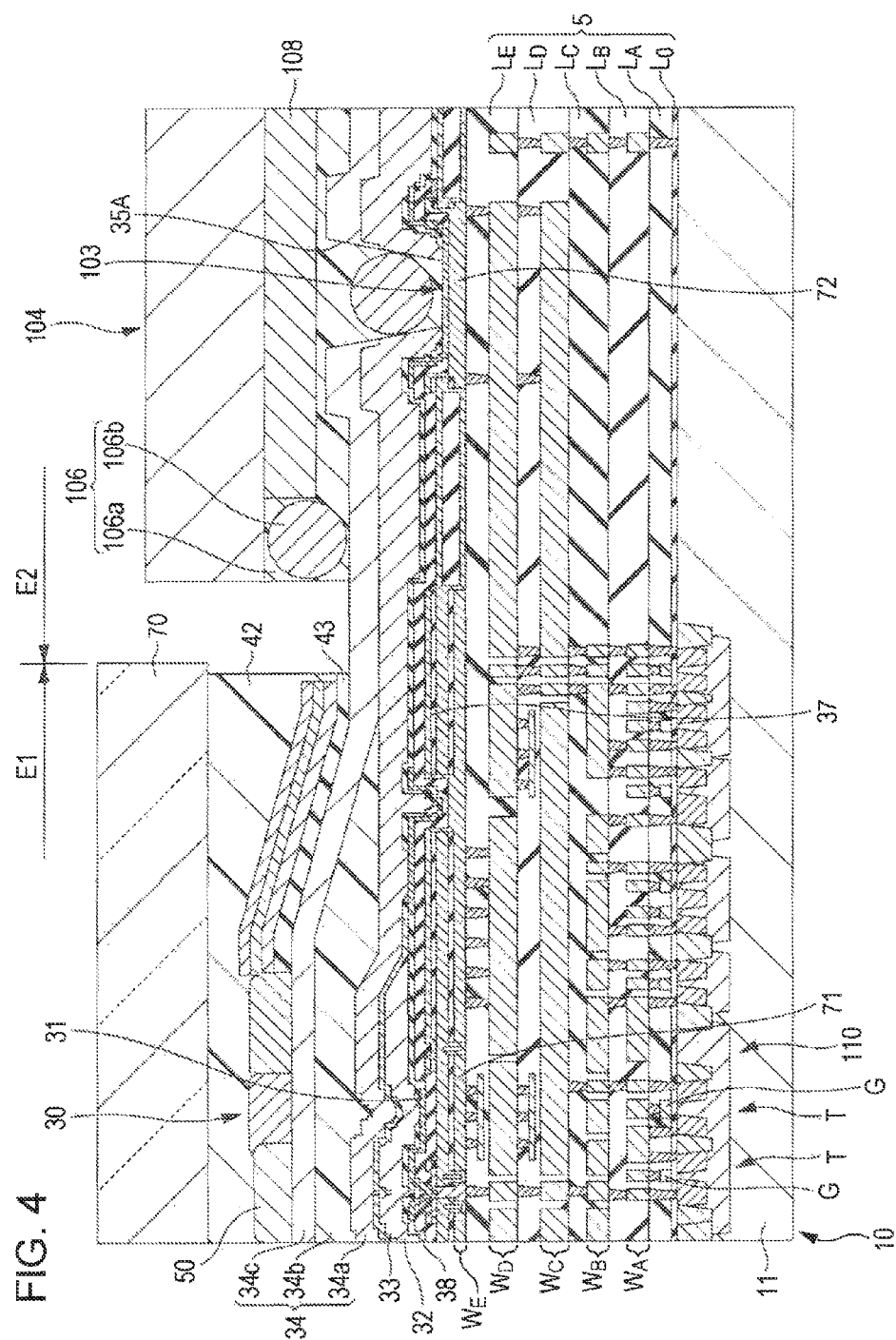
FIG. 4 is a cross-sectional view that follows a line IV-IV of the organic EL device that is shown in FIG. 1.

FIG. 4 is a cross-sectional view that follows the line IV-IV of the organic EL device that is shown in FIG. 1.

Figure 5:
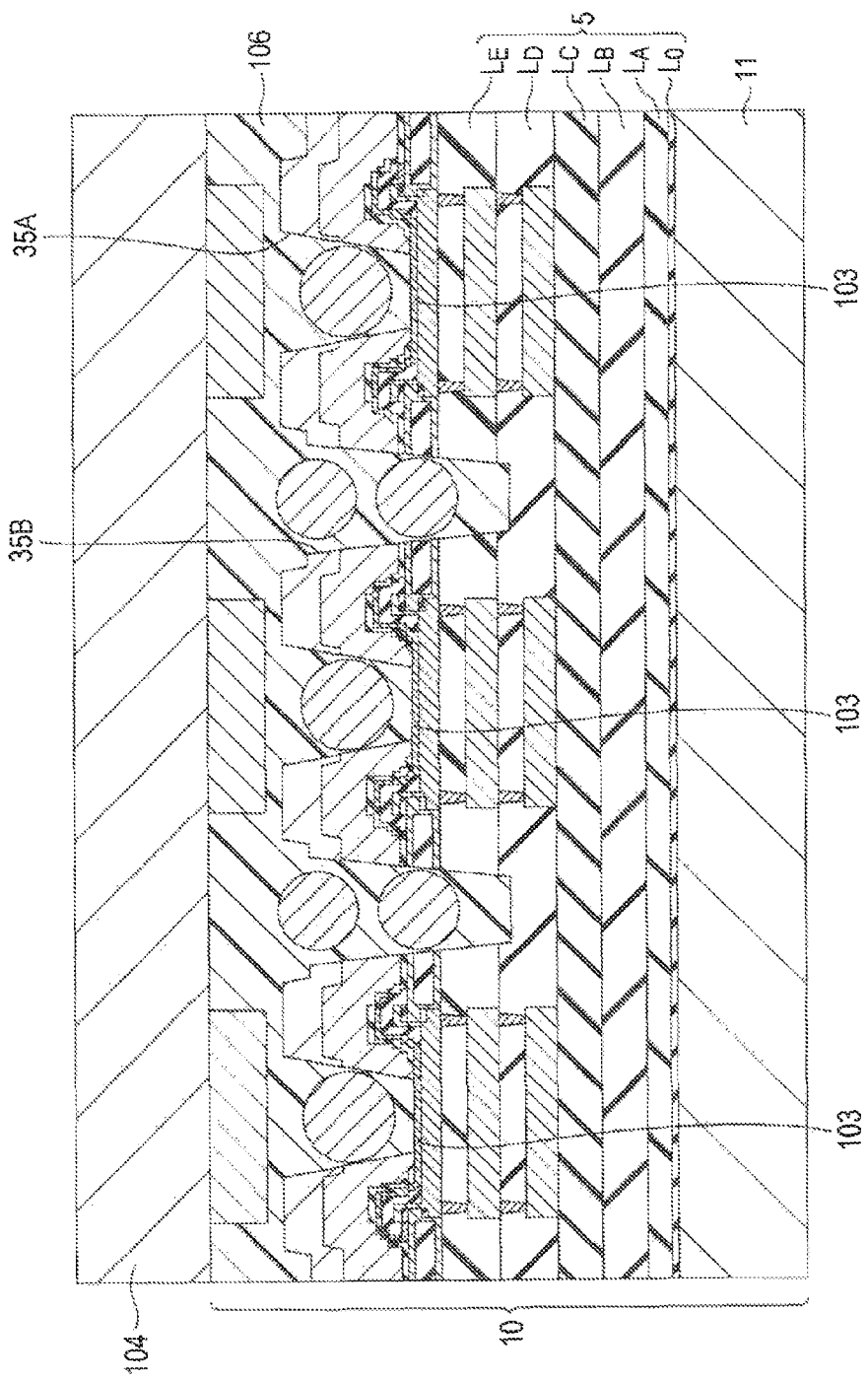
FIG. 5 is a cross-sectional view that follows a line V-V of the organic EL device that is shown in FIG. 1.

FIG. 5 is a cross-sectional view that follows the line V-V of the organic EL device that is shown in FIG. 1.

Additionally, in FIGS. 4 and 5, a plurality of conductors are illustrated as either a single metal layer or a stacked film of two to three metal layers.

As shown in FIGS. 4 and 5, the organic EL device 100 is provided with the element substrate 10 which includes a base material 11, and a circuit layer 5, which includes the pixel circuits 110, the organic EL elements 30, a sealing layer 34, which seals the plurality of organic EL elements 30, the color filters 50, and a filler 42, which are formed in order on the base material 11, and the substrate for sealing 70.

For example, the substrate for sealing 70 is formed from a substrate that is transparent with respect to visible light, such as a quartz glass, or the like, and is disposed facing the element substrate 10 with the filler 42 therebetween in order to protect the color filters 50, which are formed on the sealing layer 34 in the element substrate 10.

Emitted light from the light-emitting functional layers 32 of the sub pixels 20R, 20G, and 20B (FIG. 1) is reflected by a conductor 71, which will be described later, is transmitted by the color filters 50, and is emitted from the side of the substrate for sealing 70. That is, the organic EL device 100 is a top emission type light-emitting device.

Since the organic EL device 100 is a top emission type, in addition to a transparent substrate such as a quartz glass, or the like, it is possible to use an opaque substrate such as silicon (Si) or a ceramic as the base material 11. From this point onwards, an example of a case in which the pixel circuits 110 are used as transistors using a silicon substrate (a semiconductor substrate) as the base material 11, will be described.

As shown in FIG. 4, among the outer surface regions of the base material 11, the transistors T of the pixel circuits 110 are formed inside the display region E1, and the transistors (not illustrated in the drawing) of the data line driving circuit (not illustrated in the drawing) are formed inside a terminal region E2. The transistors T are configured to include an active region (a source-drain region), which is formed on the outer surface of the base material 11, an interlayer insulation film $L_0$ (a gate insulation film) that is coated onto the outer surface of the base material 11, and a gate G that is formed on the interlayer insulation film $L_0$. The active region (not illustrated in the drawing) is configured by an ion injection region in which impure ions are injected inside the base material 11. A channel region of the transistors T of the pixel circuit 110 is present between a source region and a drain region. Ions of different types to the active region are injected into the channel region but illustration thereof is omitted. The gate G of each transistor T is disposed in a position that faces the channel region with the interlayer insulation film $L_0$ interposed therebetween.

As shown in FIG. 4, a multi-layered wiring layer in which a plurality of interlayer insulation films ($L_A$ to $L_E$) and a plurality of wiring layers ($W_A$ to $W_E$) are alternately stacked, is formed on the interlayer insulation film $L_0$, on which the gate G of each transistor T is formed. For example, each interlayer insulation film $L_A$ to $L_E$ is formed using an inorganic material having an insulating property such as a silicon compound (typically silicon nitride or silicon oxide), or the like. For example, each wiring layer $W_A$ to $W_E$ is formed using a conductive material having low resistance that contains aluminum, silver, or the like.

Among the upper surface regions of the interlayer insulation film $L_E$, the conductor 71, which is formed from a stacked film of (Ti)/AlCu (aluminum copper alloy), is provided inside a pixel region of the display region E1. The conductor 71 is electrically connected to one of the electrodes of the transistors T that configure the pixel circuits 110.

Among the upper surface regions of the interlayer insulation film $L_E$, a conductor 72, which is formed from a material having the same light reflective properties as the conductor 71, is provided in the terminal region E2. The conductor 72 is electrically connected to one of the electrodes of the transistors T that configure the data line driving circuit 101.

A Cav adjustment layer 61, which is formed from SiN, is formed on the upper surface of the interlayer insulation film $L_E$ to cover the conductors 71 and 72. A planarization layer 37, which is formed from $SiO_2$, and a light-blocking layer 39, which is formed from TiN, are formed on the Cav adjustment layer 61. A first optical adjustment layer 62 and a second optical adjustment layer 63 are stacked on the Cav adjustment layer 61 to cover the planarization layer 37 and the light-blocking layer 39. The first optical adjustment layer 62 and the second optical adjustment layer 63 are stacked in this order on the Cav adjustment layer 61 and are respectively configured from $SiO_2$.

The pixel electrodes 31 are formed on the upper surface of the second optical adjustment layer 63. The mounting terminals 103 are formed on the upper surface of the conductor 72. The mounting terminals 103 function as connection terminals with an external connection substrate 104 as a result of the conductor 72 and a plurality of wiring layers that are more toward a lower layer side than the conductor 72.

On the upper surface of the second optical adjustment layer 63, which includes the pixel electrodes 31, parts of the pixel electrodes 31 are exposed, and a pixel separation layer 38, which separates adjacent sub pixels 20R, 20G, and 20B (FIG. 1), is formed. The pixel separation layer 38 is also formed in the terminal region E2, and a part of the outer surface of the mounting terminals 103 is exposed via opening holes 35A.

The light-emitting functional layers 32 are formed using a gas phase process such as a vacuum vapor deposition technique so as to come into contact with the pixel electrodes 31, and cover a part of the outer surface of the pixel separation layer 38. Additionally, the light-emitting functional layers 32 may be formed in regions that are partitioned by the pixel separation layer 38.

For example, the light-emitting functional layers 32 include a positive hole injection layer, a positive hole transport layer, an organic light-emitting layer, an electron transport layer, and an electron injection layer. In the present embodiment, the light-emitting functional layers 32 are formed by forming the positive hole injection layer, the positive hole transport layer, the organic light-emitting layer, the electron transport layer, and the electron injection layer as films and stacking the layers together in order on the pixel electrodes 31 using respectively gas phase processes. Additionally, the layer configuration of the light-emitting functional layers 32 is not limited to this configuration, and may further include an intermediate layer that controls the movement of positive holes and electrons, which are carriers, and for example, it is possible to reduce the number of layers by causing the organic light-emitting layer to have a function as an electron transport layer. The organic light-emitting layer may have any configuration in which white light emission can be obtained, and for example, it is possible to adopt a configuration in which an organic light-emitting layer in which red light emission can be obtained, an organic light-emitting layer in which green light emission can be obtained and an organic light-emitting layer in which blue light emission can be obtained, are combined.

The common electrode 33 is a common cathode of a plurality of organic EL elements 30 and is formed covering the light-emitting functional layers 32. For example, the common electrode 33 is formed by forming an alloy of Mg and Ag into a film at a film thickness (for example, 10 nm to 30 nm) of an extent at which a light transmissive property and a light reflective property can be obtained. In the present embodiment, the optical transmission rate of the common electrode 33 is preferably 20% or more, and is more preferably 30% or more, and the optical reflectance of the common electrode 33 is preferably 20% or more, and is more preferably 50% or more. As a result of this, a plurality of organic EL elements 30 are completed.

An optical resonator may be configured between the conductor 71 and the common electrode 33 for each sub pixels 20R, 20G, and 20B by forming the common electrode 33 in a state of having a light transmissive property and a light reflective property. The optical resonators are components from which light of specific resonance wavelengths is emitted as a result of differentiating the optical distance between the conductor 71 and the common electrode 33 for each sub pixels 20R, 20G, and 20B. As a result of this, it is possible to improve the color purity of the emitted light from each sub pixel 20R, 20G, and 20B. The above-mentioned optical distance is determined as the total of the products of refractive index and the film thickness of each type of active layer that configures the optical resonators and is interposed between the conductor 71 and the common electrode 33. Accordingly, a method of differentiating the film thickness of the pixel electrodes 31 for each color, and a method of differentiating the film thicknesses of the first optical adjustment layer 62 and the second optical adjustment layer 63 between the conductor 71 and the pixel electrodes 31, are examples of a method of differentiating the above-mentioned optical distance for each sub pixels 20R, 20G, and 20B. In a case in which the organic EL elements 30 have a resonance structure in the abovementioned manner, light that is emitted from the organic EL elements 30 is light that is output to a sealing layer 34 side, which will be mentioned later, from the common electrode 33, and is light of a spectrum that differs from the spectrum of light that is emitted in inner sections of the light-emitting functional layers 32.

Next, the sealing layer 34 is formed so as to cover the plurality of organic EL elements 30 so that water, oxygen, and the like, cannot infiltrate therein. The sealing layer 34 of the present embodiment is a component in which a first sealing film (sealing film) 34a, a buffer film 34b, and a second sealing film (sealing film) 34c, are stacked in order from a common electrode 33 side.

Additionally, the gas barrier properties of the sealing layer 34 are not particularly limited to as long as they are of an extent at which it is possible to protect the organic EL elements 30 from oxygen and water in atmospheric air, a degree of oxygen transmissivity of 0.01 cc/m²/day or less is preferable, a degree of water vapor permeability of $7 \times 10^{-3}$ g/m²/day or less, or better still $5 \times 10^{-4}$ g/m²/day or less is preferable, and $5 \times 10^{-6}$ g/m²/day or less is particularly preferable. It is preferable that the transmittance of light of the sealing layer 34 be 80% or more with respect to ejected light from the common electrode 33.

For example, a silicon oxide film (SiO), a silicon nitride film ($Si_xN_y$), a silicon oxynitride film ($SiO_xN_y$), which are inorganic materials having a light transmissive property and excellent gas barrier properties, or a material in which one of the above is set as a main component, is preferable as the first sealing film 34a and the second sealing film 34c.

It is possible to exemplify a vacuum vapor deposition technique, a sputtering technique, a Chemical Vapor Deposition (CVD) technique, an ion plating technique, or the like as a formation method of the first sealing film 34a and the second sealing film 34c. It is possible to realize higher gas barrier properties as the film thicknesses of the first sealing film 34a and the second sealing film 34c are increased, but meanwhile, it is easy for cracking to occur due to film stress that is caused by expansion and contraction of the film. Accordingly, it is preferable to control the respective film thicknesses to an extent of 200 nm to 1000 nm, and in the present embodiment, high gas barrier properties are realized by stacking the first sealing film 34a and the second sealing film 34c with the buffer film 34b interposed therebetween.

For example, the buffer film 34b can be formed using an epoxy-based resin or a coating type inorganic material (silicon oxide or the like) having excellent thermal stability. In addition, as long as the buffer film 34b is coated and formed using a printing technique such as screen printing or a constant discharge technique, it is possible to planarize the outer surface of the buffer film 34b. In other words, it is also possible to cause the buffer film 34b to function as a planarization layer that alleviates unevenness of the outer surface of the first sealing film 34a. The thickness of the buffer film 34b is 1 µm to 5 µm, and more preferably is in a range of 1.5 µm to 2.0 µm.

In the present embodiment, as shown in FIG. 4, the sealing structure in the terminal region E2 is mainly configured by the first sealing film 34a and the second sealing film 34c, and does not have a configuration in which the buffer film 34b is interposed between the first sealing film 34a and the second sealing film 34c in the manner of the display region E1. In the display region E1, since considerable unevennesses occur due to structures such as the pixel circuits 110 and the organic EL elements 30, it is necessary to alleviate the unevennesses as a result of interposing the buffer film 34b. On the other hand, in the terminal region E2, since the organic EL elements 30, and the like, are not present, it is not necessary to take the unevenness of the lower layer into consideration to that extent.

The opening holes 35A are formed in the first sealing film 34a and the second sealing film 34c, which are present in the terminal region E2, in positions that respectively corresponds to the plurality of mounting terminals 103. The outer surface of at least a part of each mounting terminal 103 is exposed to the outside via the opening holes 35A that are provided in the first sealing film 34a and the second sealing film 34c.

The colored layers 50R, 50G, and 50B, which correspond to each color of the sub pixels 20R, 20G, and 20B, are formed on the sealing layer 34. Examples of a formation method of the color filters 50, which are configured by the colored layers 50R, 50G, and 50B include a method of forming a photosensitive resin layer through coating of a photosensitive resin in which a color material such as a dye or a pigment that corresponds to each color, is dispersed in a solvent, and exposing and developing the photosensitive resin layer using a photolithography technique.

The film thickness of the colored layers 50R, 50G, and 50B may be the same for all of the colors, or at least one color may be differentiated from the other colors. In either case, the film thickness is set so that appropriate chromaticity and white balance are obtained when emitted light from the organic EL elements 30 passes through each colored layer (50R, 50G, and 50B).

The substrate for sealing 70 is bonded to the element substrate 10 using the filler 42 in the display region E1 of the element substrate 10. As the function of the filler 42, a material having favorable wettability and adhesiveness with the substrate for sealing 70 and the element substrate 10 is set, and in addition, transparency with respect to emitted light from the organic EL element 30 is necessary. Therefore, for example, it is possible to exemplify a resin material such as a urethane-based resin, an acrylic-based resin, an epoxy-based resin, or a polyolefin-based resin as the filler 42. For example, the thickness of the filler 42 is 10 µm to 100 µm.

The external connection substrate 104 is disposed facing the terminal region E2 of the element substrate 10, and is fixed to the element substrate 10 via an Anisotropic Conductive Film (ACF, a conductive adhesion film) 106. Alternatively, a paste form anisotropic conductive film (ACP: anisotropic conductive paste) may be used. The anisotropic conductive film 106 is a film in which metallic particles 106b are mixed into a thermosetting resin 106a, and the mounting terminals 103 on the element substrate 10 side and external connection terminals 108 of the external connection substrate 104 are electrically connected via these metallic particles 106b.

Next, the characteristic portions of the invention will be explained.

Figure 6:
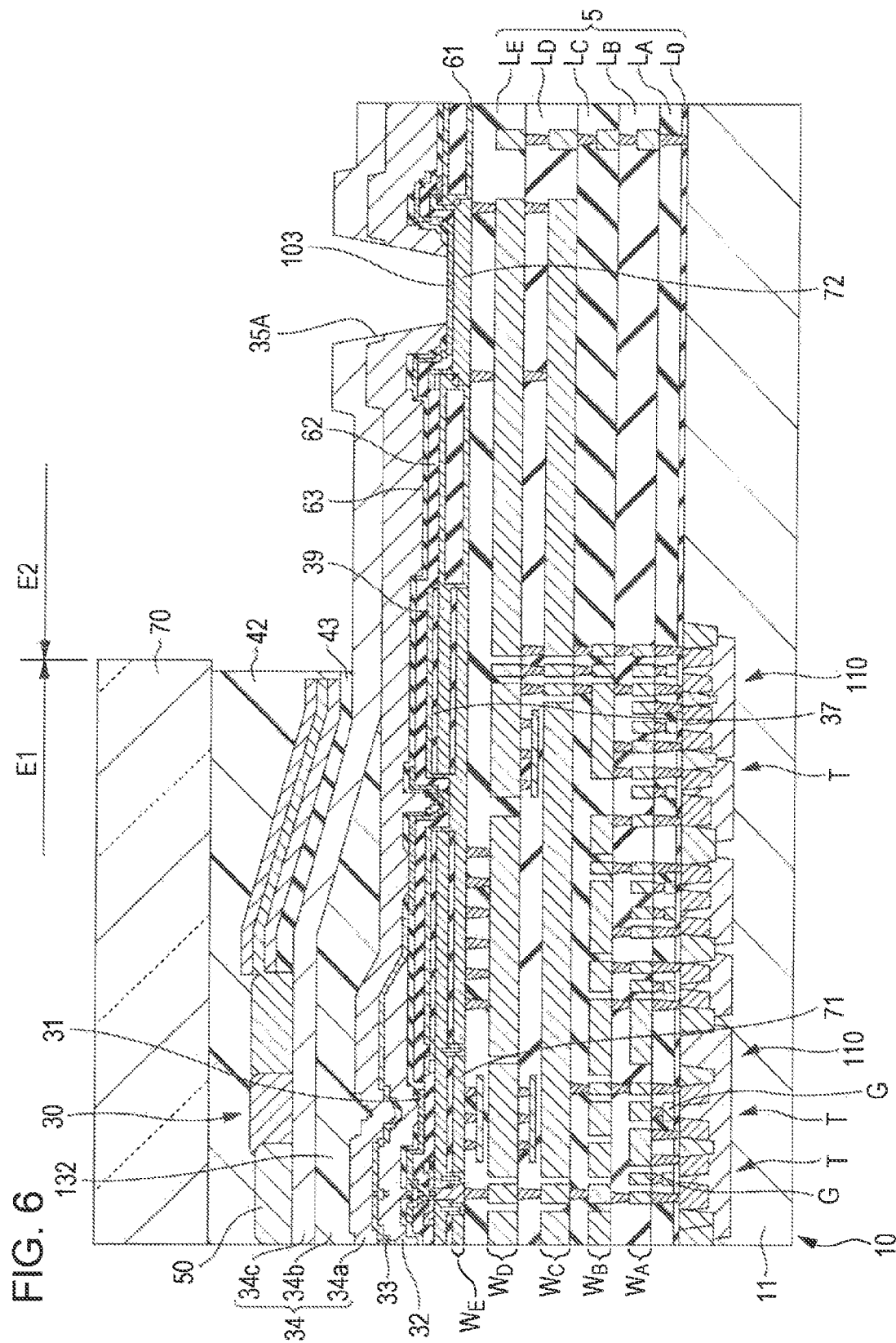
FIG. 6 is a cross-sectional view of the element substrate, that follows the line VI-VI of the organic EL device that is shown in FIG. 1.

FIG. 6 is a cross-sectional view of the element substrate, that follows the line VI-VI of the organic EL device that is shown in FIG. 1.

Figure 7:
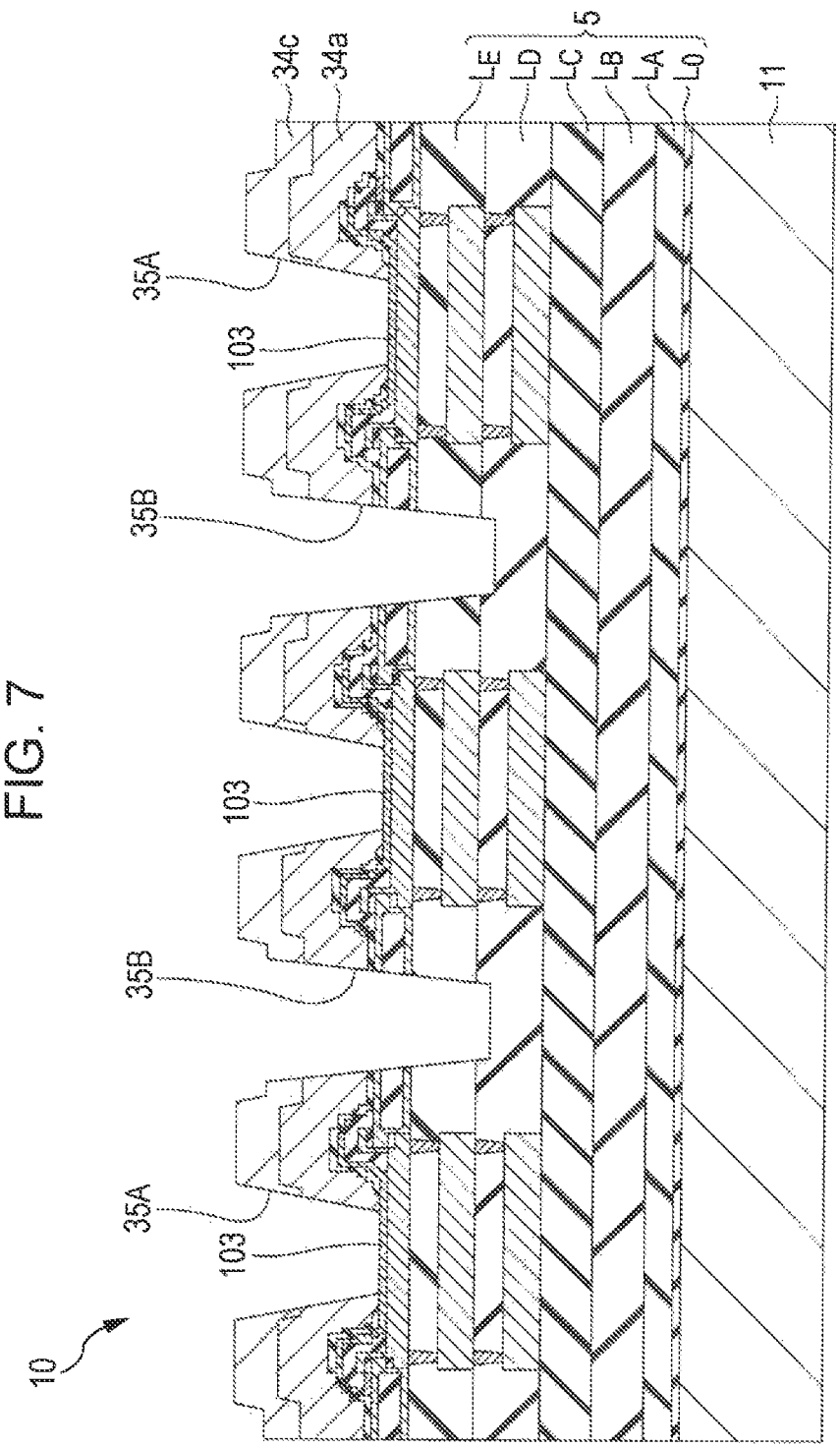
FIG. 7 is a cross-sectional view of the element substrate, that follows the line VII-VII of the organic EL device that is shown in FIG. 1.

FIG. 7 is a cross-sectional view of the element substrate, that follows the line VII-VII of the organic EL device that is shown in FIG. 1.

As shown in FIGS. 6 and 7, in the organic EL device 100 of the present embodiment, apart from on the mounting terminals 103, portions without the first sealing film 34a and the second sealing film 34c are present in the terminal region E2. More specifically, opening holes 35B are provided between each of the plurality of mounting terminals 103 that are arranged in the terminal region E2 aligned in the X direction.

The opening holes 35B are formed at the same time as the opening holes 35A are formed on the first sealing film 34a and the second sealing film 34c of the terminal region E2. In addition to just the first sealing film 34a and the second sealing film 34c, the opening holes 35B are configured to include a plurality of layers that are more toward the lower layer side than the first sealing film 34a and the second sealing film 34c. The opening holes 35B are formed from the second sealing film 34c up to the interlayer insulation film $L_D$, which configures the circuit layer 5, and are formed from the concave grooves that include the interlayer insulation film $L_E$, which is positioned on the upper layer side of the circuit layer 5, and a part of the interlayer insulation film $L_D$.

The groove depth of the opening holes 35B is greater than that of the opening holes 35A, and the opening holes 35B are filled with more anisotropic conductive film 106 than the opening hole 35A side.

The size of the opening holes 35B when viewed from the normal line direction of the element substrate 10, is set as appropriate, and it is preferable that the opening holes 35B be formed along the longitudinal direction of the mounting terminals 103. The length of the opening holes 35B in the longitudinal direction (the Y direction) may be the same as that of the mounting terminals 103, or may be longer than that of the mounting terminals 103.

Additionally, in the present embodiment, the opening holes 35B are provided between adjust mounting terminals 103, but the invention is not limited to this configuration, and it is sufficient as long as portions without the sealing film (34a and 34c) are present in regions of the terminal region E2 that face the external connection substrate 104. For example, portions (for example, the opening holes 35B) without the sealing film (34a and 34c) may be provided in regions between the display region E1 and the mounting terminals 103 on the display region E1 side of the mounting terminals 103.

Manufacturing Method of Organic EL Device

Next, a manufacturing method of an organic EL device of the present embodiment will be described.

In this instance, a formation method of the opening holes 35B, which are the characteristic portions of the invention, will be described.

Figure 8:
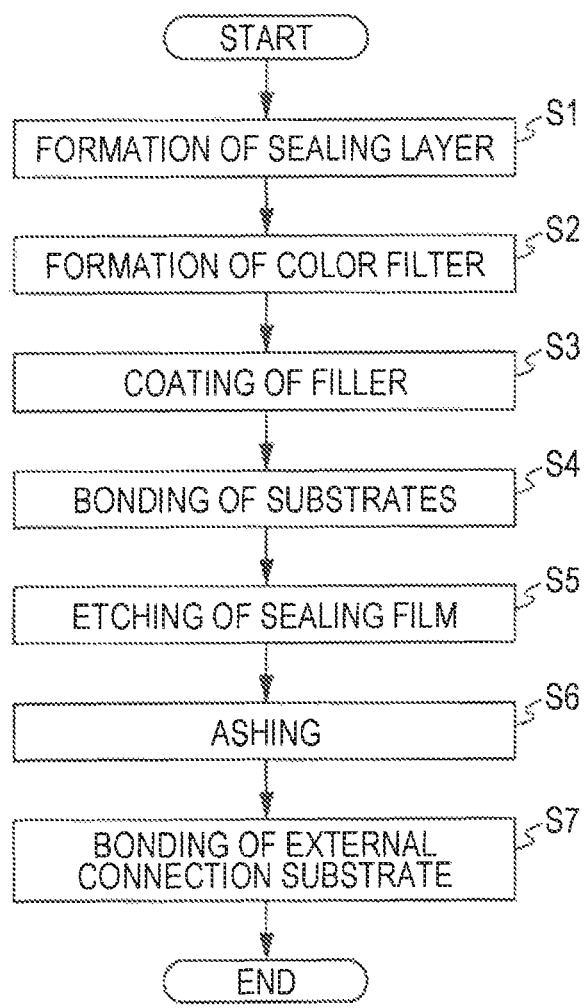
FIG. 8 is a flowchart that shows a manufacturing method of the organic EL device.

FIG. 8 is a flowchart that shows a manufacturing method of the organic EL device 100.

FIGS. 9 to 18 are schematic cross-sectional views that show the manufacturing method of the organic EL device 100.

Additionally, FIGS. 9, 11, 13, 15, and 17 are schematic cross-sectional views of a region that corresponds to FIG. 4. In addition, FIGS. 10, 12, 14, 16, and 18 are schematic cross-sectional views of a region that corresponds to FIG. 5.

As shown in FIG. 8, the manufacturing method of the organic EL device 100 of the present embodiment includes a sealing layer formation process S1, a color filter formation process S2, a filler coating process S3, a substrate bonding process S4, a sealing film etching process S5, an asking process S6 and an external connection substrate bonding process S7.

Figure 9:
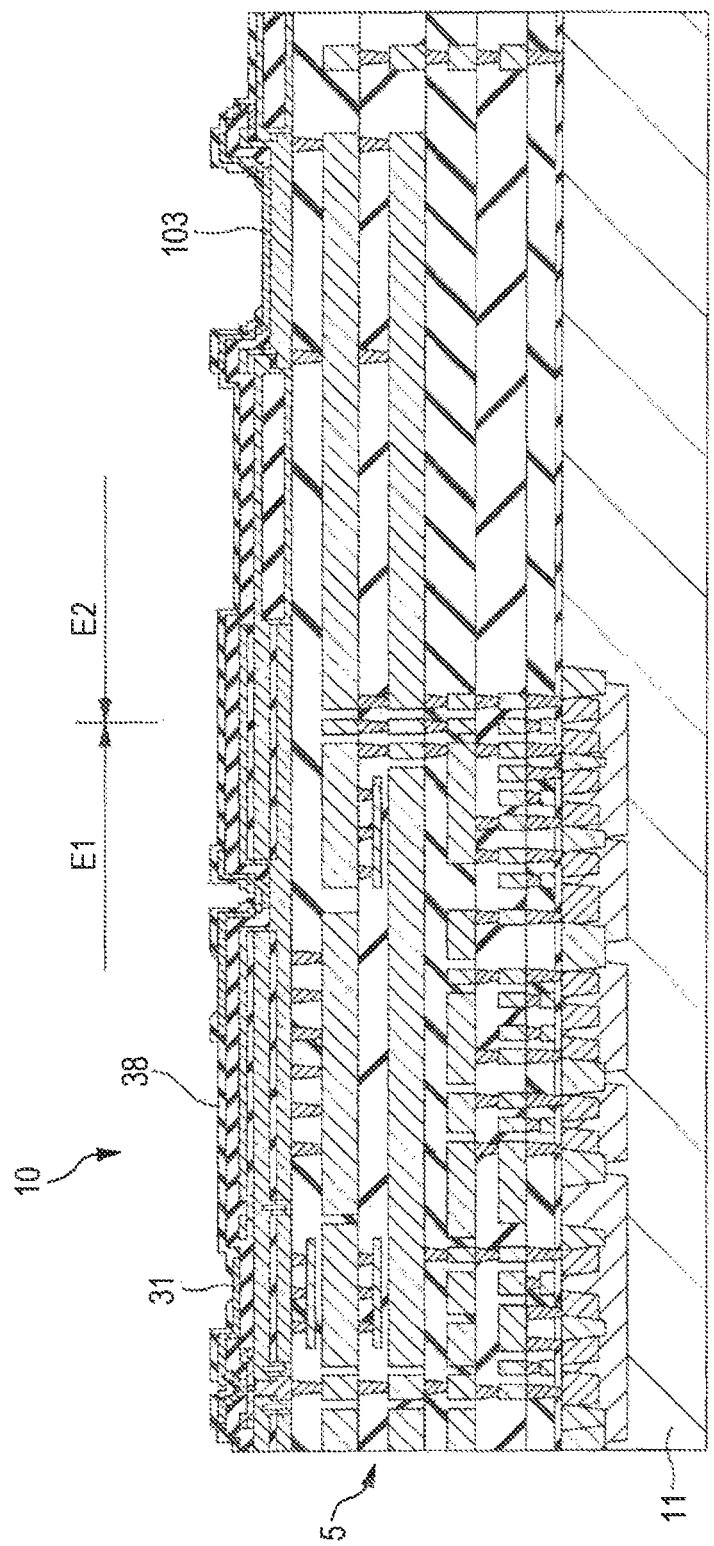
FIG. 9 is a process view that shows the manufacturing method of the organic EL device.
Figure 10:
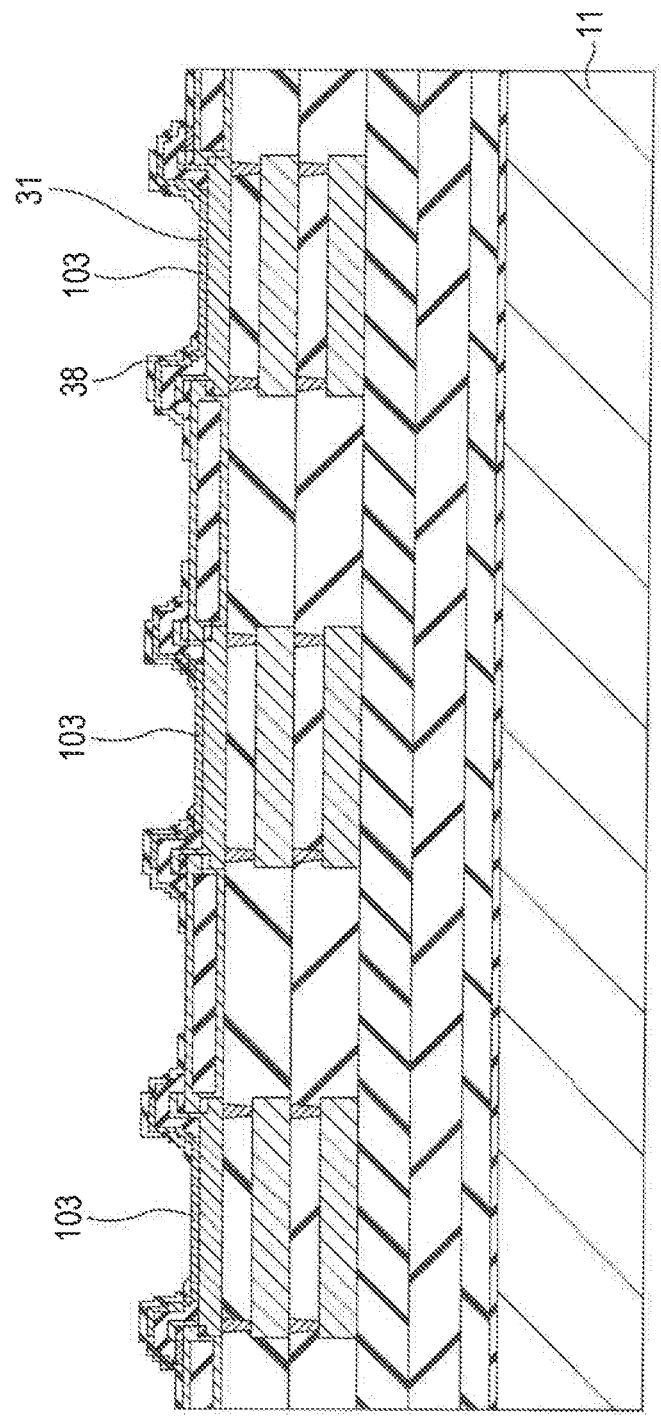
FIG. 10 is a process view that shows the manufacturing method of the organic EL device.

Additionally, the methods that form the pixel circuits 110, the circuit layer 5, which includes other peripheral circuits and signal wiring, the pixel electrodes 31, and the pixel separation layer 38 on the base material 11 can adopt publicly known film formation techniques, filling techniques, planarization techniques and other associated processes. In this manner, as shown in FIGS. 9 and 10, the circuit layer 5 to the pixel electrode 31 and the pixel separation layer 38 are formed in the display region E1 and the terminal region E2 on the base material 11.

Figure 11:
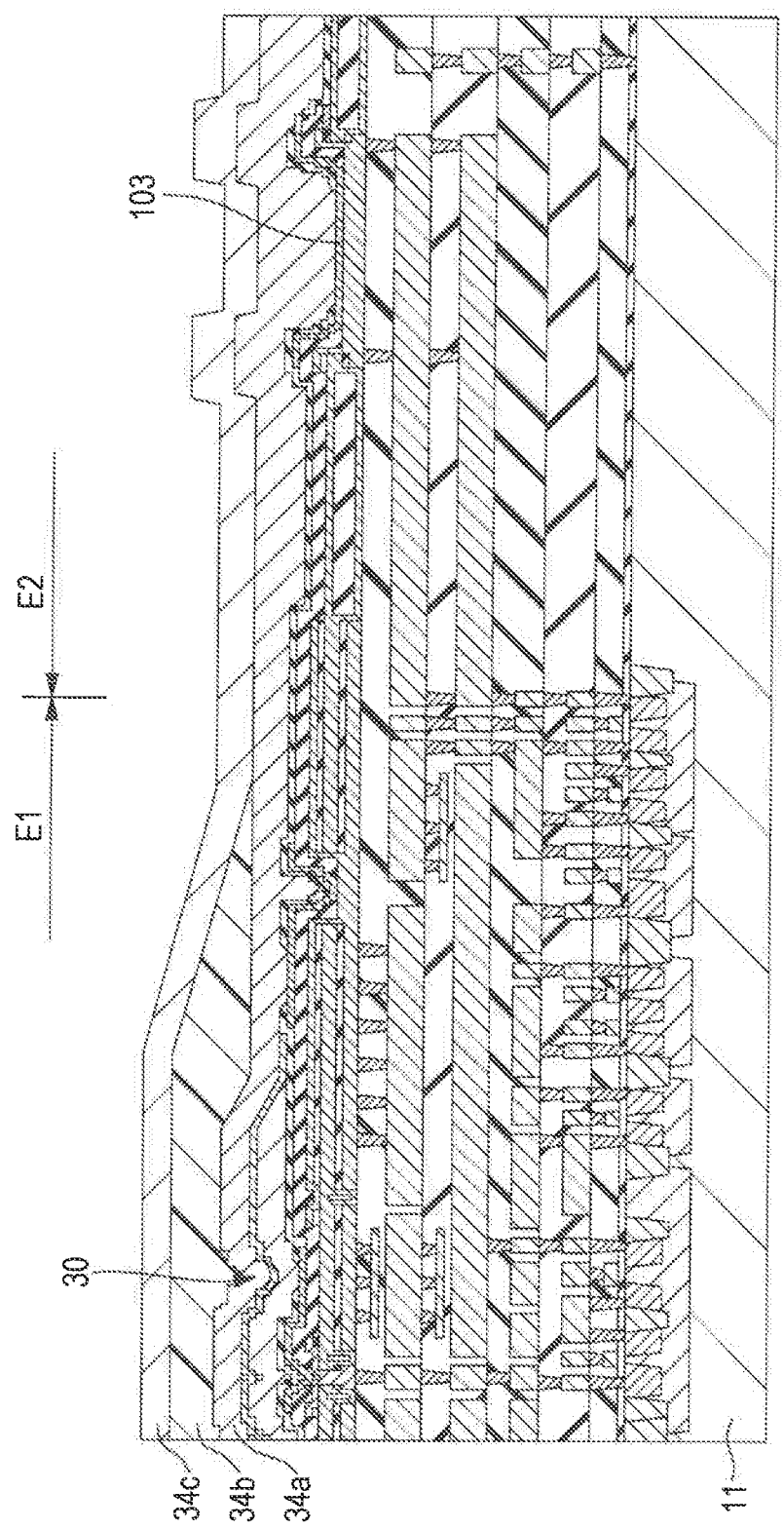
FIG. 11 is a process view that shows the manufacturing method of the organic EL device.

Thereafter, as shown in FIG. 11, the organic EL elements 30 are formed inside each sub pixel.

Sealing Layer Formation Process S1

Figure 12:
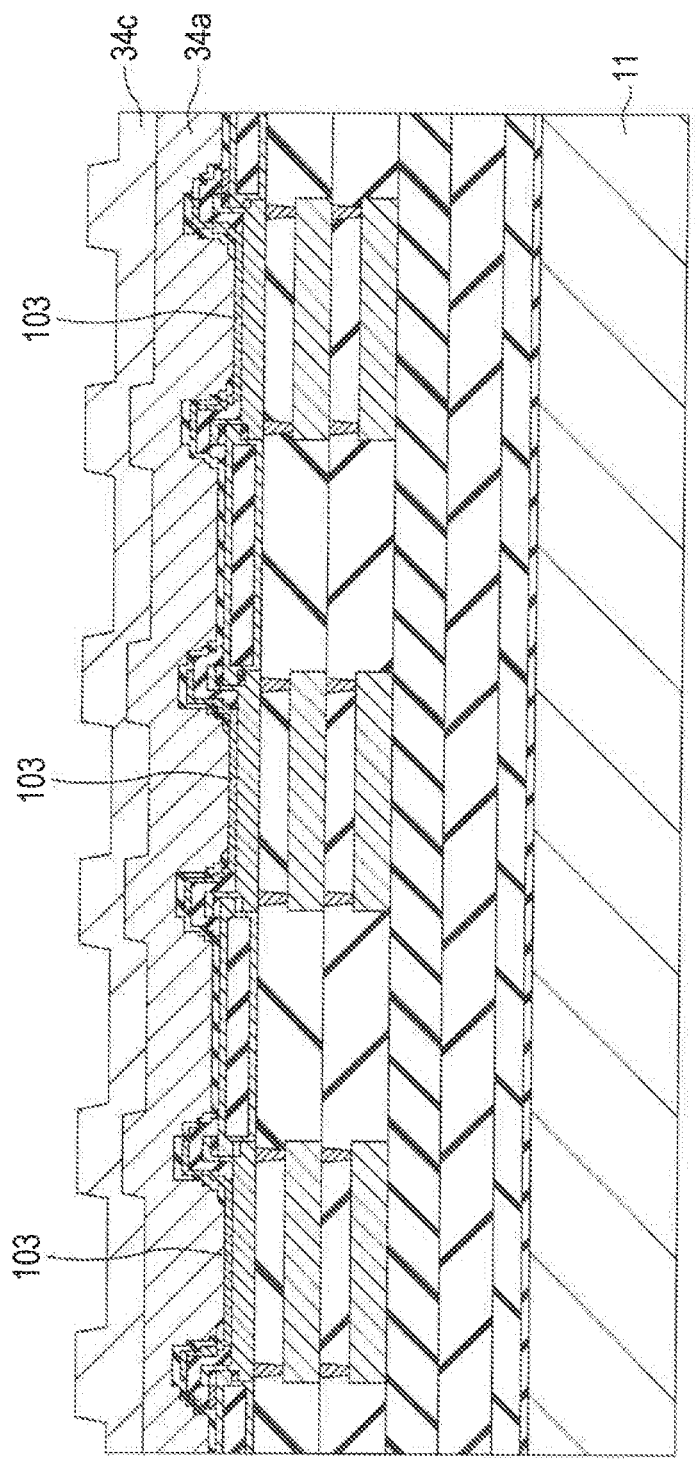
FIG. 12 is a process view that shows the manufacturing method of the organic EL device.

As shown in FIGS. 11 and 12, firstly, the first sealing film 34a, which covers the display region E1 (the common electrode 33) and the terminal region E2 (the mounting terminals 103), is formed. Examples of the method of forming the first sealing film 34a include a method of forming a silicon oxide film (SiO), a silicon nitride film ($Si_xN_y$), or a silicon oxynitride ($SiO_xN_y$), for example, into a film using a vacuum vapor deposition technique, a sputtering technique, a CVD technique, an ion plating technique, or the like. It is desirable that the film thickness of the first sealing film 34a be in a range of approximately 200 nm to 1000 nm, and in this case, the film thickness was set to 400 nm.

Next, the buffer film 34b, which covers the first sealing film 34a, is formed. It is desirable that the buffer film 34b be formed so as to recede in the display region E1 without crossing the boundary between the display region E1 and the terminal region E2. As the formation method of the buffer film 34b, for example, a buffer film 34b, which is formed from an epoxy resin, is formed using a solution that includes an epoxy resin having a transparent property and a solvent of an epoxy resin, by performing coating with a solution using a printing technique or a constant discharge technique and drying the coating. The film thickness of the buffer film 34b is preferably 1 μm to 5 μm, and more preferably is in a range of 1.5 μm to 2.0 μm. In this case, the film thickness was set to 2 μm.

Additionally, the buffer film 34b us not limited to being formed using an organic material such as an epoxy resin. For example, a silicon oxide film having a film thickness of approximately 2 μm may be formed as the buffer film 34b by performing coating with a coating type inorganic material using a printing technique, and drying and firing the coating.

Next, the second sealing film 34c, which covers the buffer film 34b, is formed in the display region E1 and the terminal region E2. The formation method of the second sealing film 34c is the same as that of the first sealing film 34a, and for example, can include a method of forming a silicon oxide film (SiO), a silicon nitride film ($Si_xN_y$), or a silicon oxynitride ($SiO_xN_y$), for example, into a film using a vacuum vapor deposition technique, a sputtering technique, a CVD technique, an ion plating technique, or the like. It is desirable that the film thickness of the second sealing film 34c be in a range of approximately 200 nm to 1000 nm, and in this case, the film thickness was set to 800 nm.

Color Filter Formation Process S2

Figure 13:
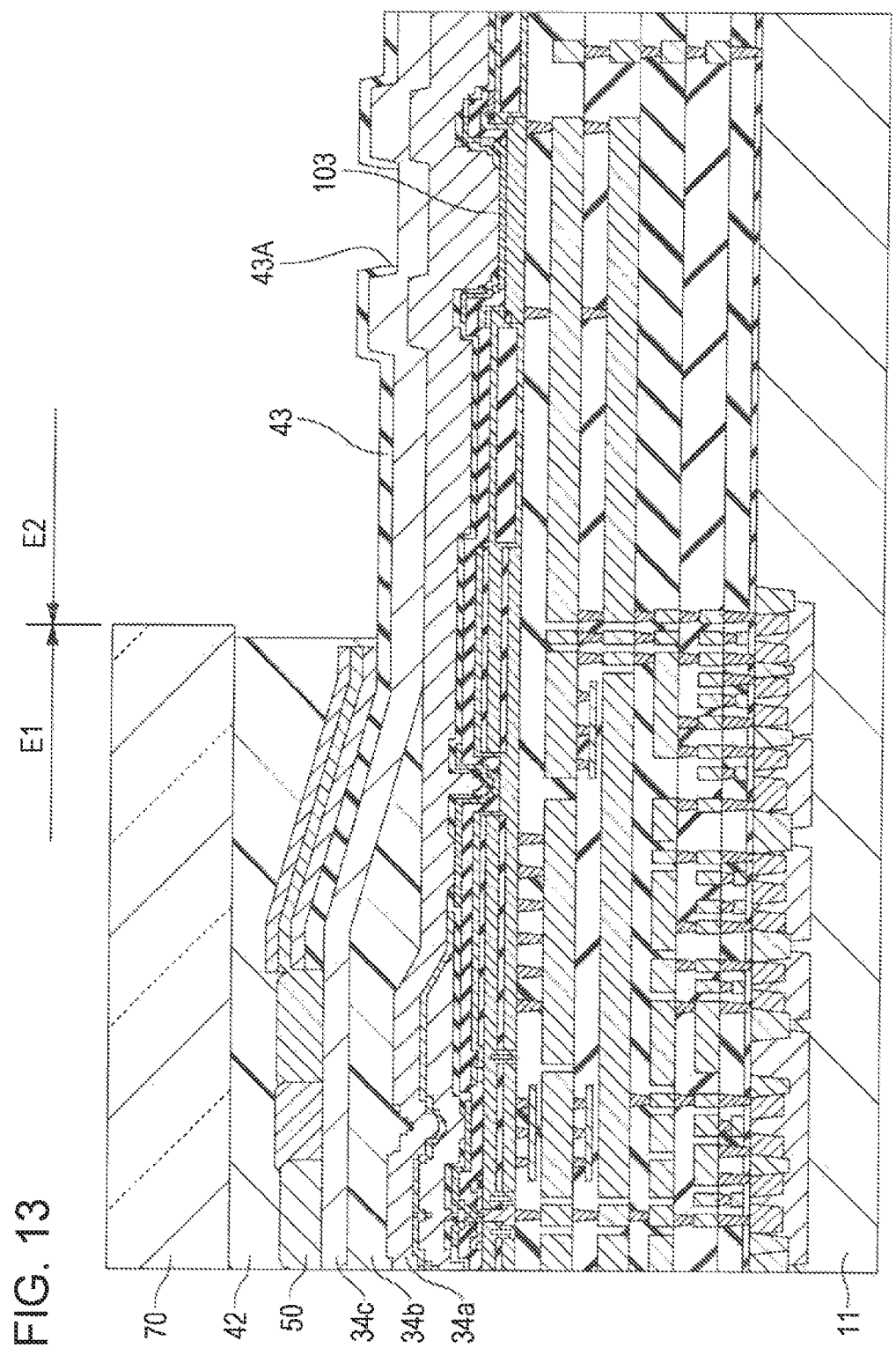
FIG. 13 is a process view that shows the manufacturing method of the organic EL device.
Figure 14:
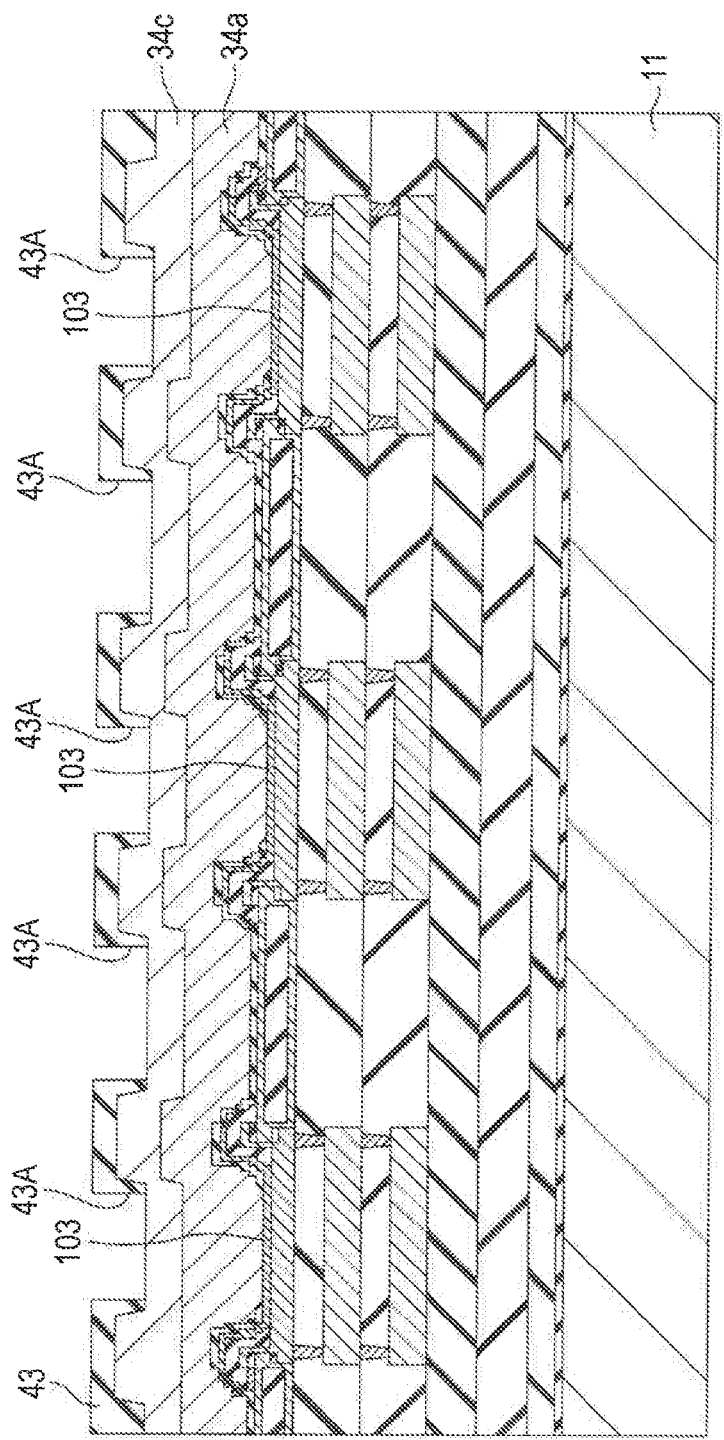
FIG. 14 is a process view that shows the manufacturing method of the organic EL device.

Firstly, as shown in FIGS. 13 and 14, an insulation layer 43 is formed on the outer surface of the second sealing film 34c. The insulation layer 43 is a component that partitions the colored layers 50R, 50G, and 50B of different colors. The insulation layer 43 is formed from a photosensitive resin material that does not include a color material. Firstly, the insulation layer 43 is formed by forming a photosensitive resin layer through coating with the photosensitive resin material, which does not include a color material, across the entire surface of the base material 11 using a spin coating technique, or the like, and exposing and developing the photosensitive resin layer. At this time, opening sections 43A are patterned and formed in regions that overlap with the mounting terminals 103, which are formed on the base material 11, in plan view. In the present embodiment, the photosensitive resin layer is patterned so as to form the opening sections 43A, which expose the regions that correspond to the mounting terminals 103. In this manner, the insulation layer 43 is formed.

Next, as shown in FIG. 13, the color filters 50 are formed inside the display region E1.

Firstly, a photosensitive resin layer is formed to cover the insulation layer 43 through coating and drying of a photosensitive resin that includes a green color material, for example, using a spin coating technique. Subsequently, as shown in FIG. 13, the green (G) colored layers 50G are formed by exposing and developing the corresponding photosensitive resin layer. In the present embodiment, the film thickness of the colored layers 50G is set to a range of 1.0 μm to 2.0 μm so that appropriate optical characteristics can be obtained. In addition, although not illustrated in the drawings, coating of a photosensitive resin, which includes a color material of each color, is performed in the same manner for red and blue, and the colored layers 50R and 50B are formed as shown in FIG. 13 by performing exposure and development. That is, it is necessary to perform the treatments from coating to exposure and development a number of times that corresponds to the number of colors of color filter that are used.

Filler Coating Process S3

As shown in FIG. 13, coating of the filler 42 is performed to cover the colored layers 50G (50). A thermosetting type epoxy-based resin is used in the filler 42 in consideration of the transmittivity of light that is emitted from the organic EL elements 30 and the adhesiveness with the color filters 50 and the substrate for sealing 70. In addition to a thermosetting type epoxy-based resin, the same effects can be obtained with a resin material such as a urethane-based resin, an acrylic-based resin or a polyolefin-based resin, for example. Since the unevennesses of structures such as the organic EL elements 30, for example, are reduced due to the effect of the buffer film 34b, the filler 42 can be coated onto the outer surfaces of the color filters 50 and the second sealing film 34c with high flowability. Additionally, the final thickness of the filler 42 is approximately 10 to 100 μm.

Substrate Bonding Process S4

As shown in FIG. 13, the substrate for sealing 70 is disposed in a predetermined position facing the base material 11 on which the filler 42 is coated using vacuum suction, or the like, for example. Quartz glass is used in the substrate for sealing 70 in consideration of light transmissive properties, handling properties and the influence of the reaction products due to a subsequent sealing film etching process. 0.5 mm to 1.2 mm is suitable as the thickness of the substrate for sealing 70. In the present embodiment, a 0.7 mm substrate is used.

A predetermined pressing force is applied to the substrate for sealing 70, which is disposed in a facing manner, and filler 42 that is not hardened is thoroughly spread about in plan view interposed between the base material 11 and the substrate for sealing 70. At this time, there is a concern that the filler 42 will leak out from the end section of the substrate for sealing 70 (the boundary surfaces with the terminal region E2), reach the terminal region E2 and cover the mounting terminals 103. Accordingly, it is preferable to manage the process so that the filler 42 does not leak out into the terminal region E2, using adjustment of the coating amount of the filler 42, and the extents of the planar surface of the substrate for sealing 70 and the pressurization. Incidentally, since it likely that display defects will be brought about if there are residual air bubbles in the inner section of the filler 42, it is more preferable to perform the pressing force work in a vacuum (atmospheric pressure or less) atmosphere.

After the above-mentioned work, the element substrate 10 and the substrate for sealing 70 are bonded by hardening the filler 42 at a temperature and for a duration that correspond to the curing conditions of the filler 42. Additionally, since the filler 42 extends in a planar manner as a result of pressurizing the substrate for sealing 70, the filler 42 need not necessarily be coated over the entirety of the display region E1 in the above-mentioned filler coating process S3.

Sealing Film Etching Process S5

Figure 15:
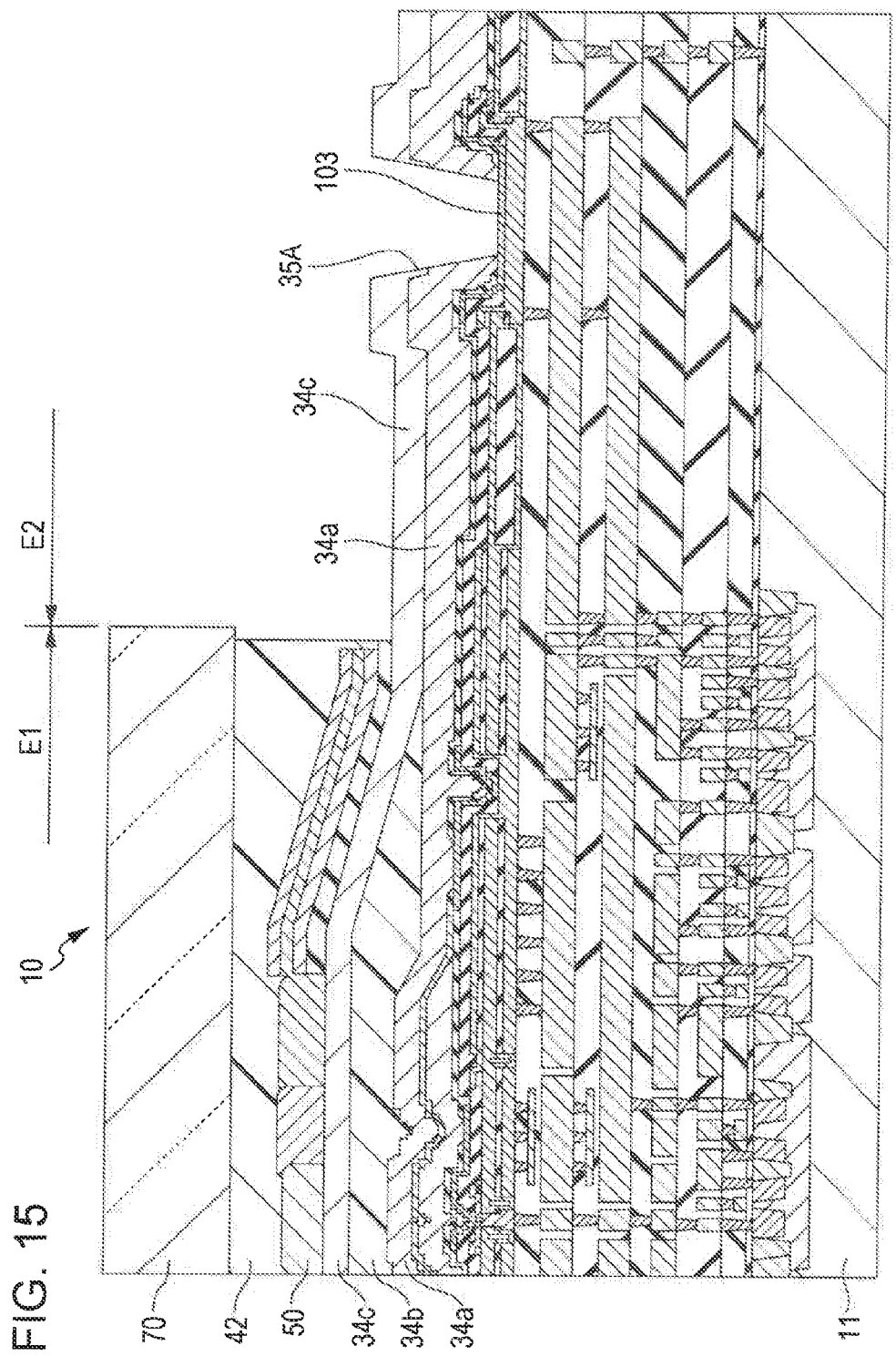
FIG. 15 is a process view that shows the manufacturing method of the organic EL device.
Figure 16:
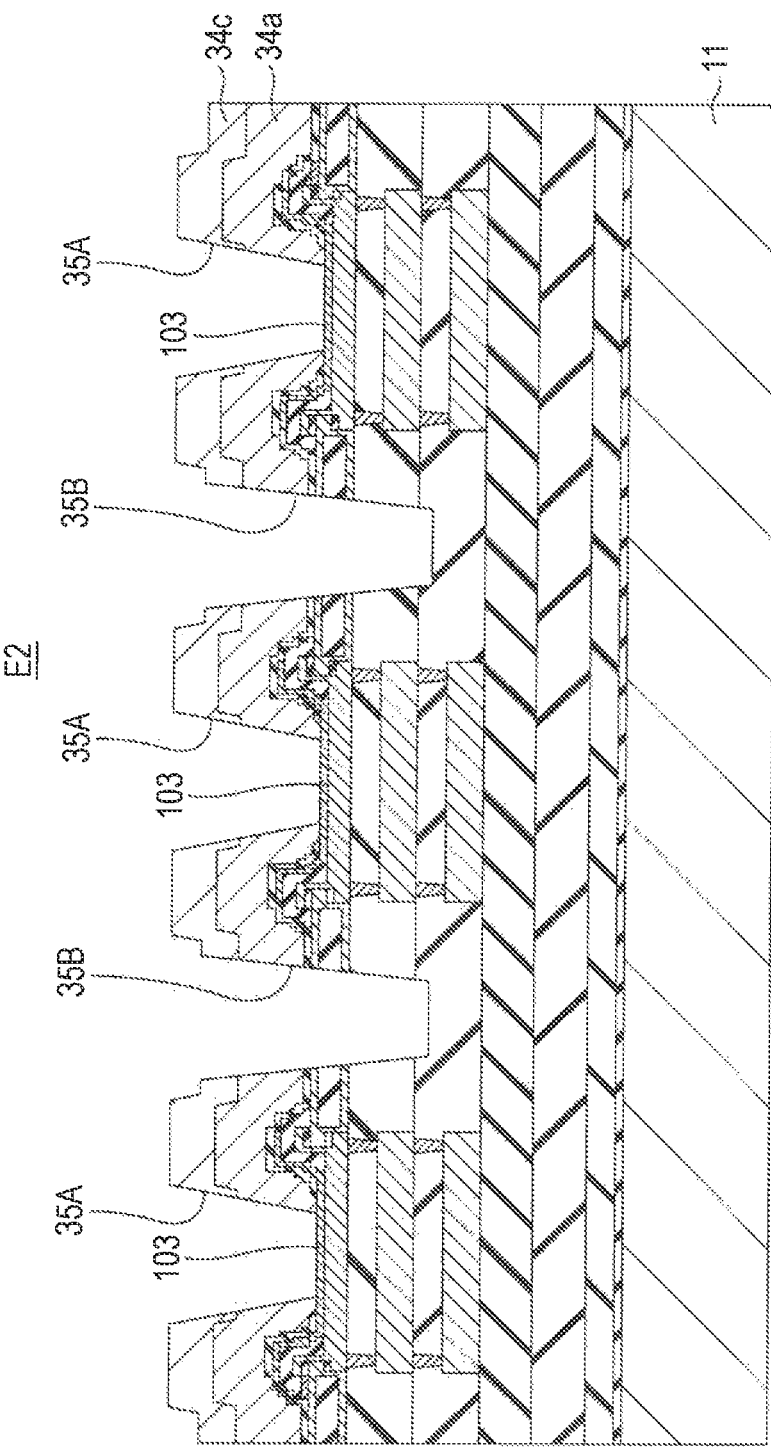
FIG. 16 is a process view that shows the manufacturing method of the organic EL device.

The first sealing film 34a and the second sealing film 34c inside the opening sections 43A are removed by etching with the insulation layer 43, which is shown in FIGS. 13 and 14 set as a mask. In this manner, as shown in FIGS. 15 and 16, the first sealing film 34a and the second sealing film 34c on the mounting terminals 103 are partially removed, the opening holes 35A, which expose the mounting terminals 103, are formed, and the opening holes 35B, which expose the interlayer insulation film $L_D$, are formed.

Examples of a method for selectively etching the first sealing film 34a and the second sealing film 34c, which are formed from inorganic films such as a silicon oxide film (SiO), a silicon nitride film ($Si_xN_y$), or a silicon oxynitride film ($SiO_xN_y$), include dry etching using a fluorine-based treatment gas such as trifluoride methane ($CHF_3$), carbon tetrafluoride ($CF_4$), nitrogen trifluoride ($NF_3$), or sulfur hexafluoride ($SF_6$).

The dry etching is performed by applying a high-frequency voltage on the basis of a predetermined gas flow rate, and chamber pressure. By radiating the sealing film (34a and 34c), the substrate for sealing 70, and the like, with plasma particles depending on the type of gas, target radiation objects are scraped away by creating a volatile substance as a result of a chemical reaction occurring between the plasma particles and the sealing film (34a and 34c), which is the target radiation object.

Among the regions of the terminal region E2, the first sealing film 34a and the second sealing film 34c overlap in a region that is between a region that corresponds to a mounting terminal 103 and an adjacent mounting terminal 103. Further, both sealing films (34a and 34c) are either a silicon oxide film (SiO), a silicon nitride film ($Si_xN_y$), or a silicon oxynitride film ($SiO_xN_y$), and have either Si or SiO as the main component thereof. Accordingly, it is possible to collectively remove the first sealing film 34a and the second sealing film 34c using the same type of etching gas.

As explained earlier, aluminum (Al) and indium tin oxide (ITO) are used in the mounting terminals 103. Accordingly, after the sealing film (34a and 34c) that covers the mounting terminals 103 is selectively removed, the mounting terminals 103 are protected from the sealing film etching process as a result of the mounting terminals 103 themselves acting as favorable etching stops.

Next, after the opening holes 35A and the opening holes 35B are formed in the first sealing film 34a and the second sealing film 34c, the entire insulation layer 43, which is present inside the terminal region E2 is removed by performing etching with the substrate for sealing 70 as a mask.

External Connection Substrate Bonding Process S7

Figure 17:
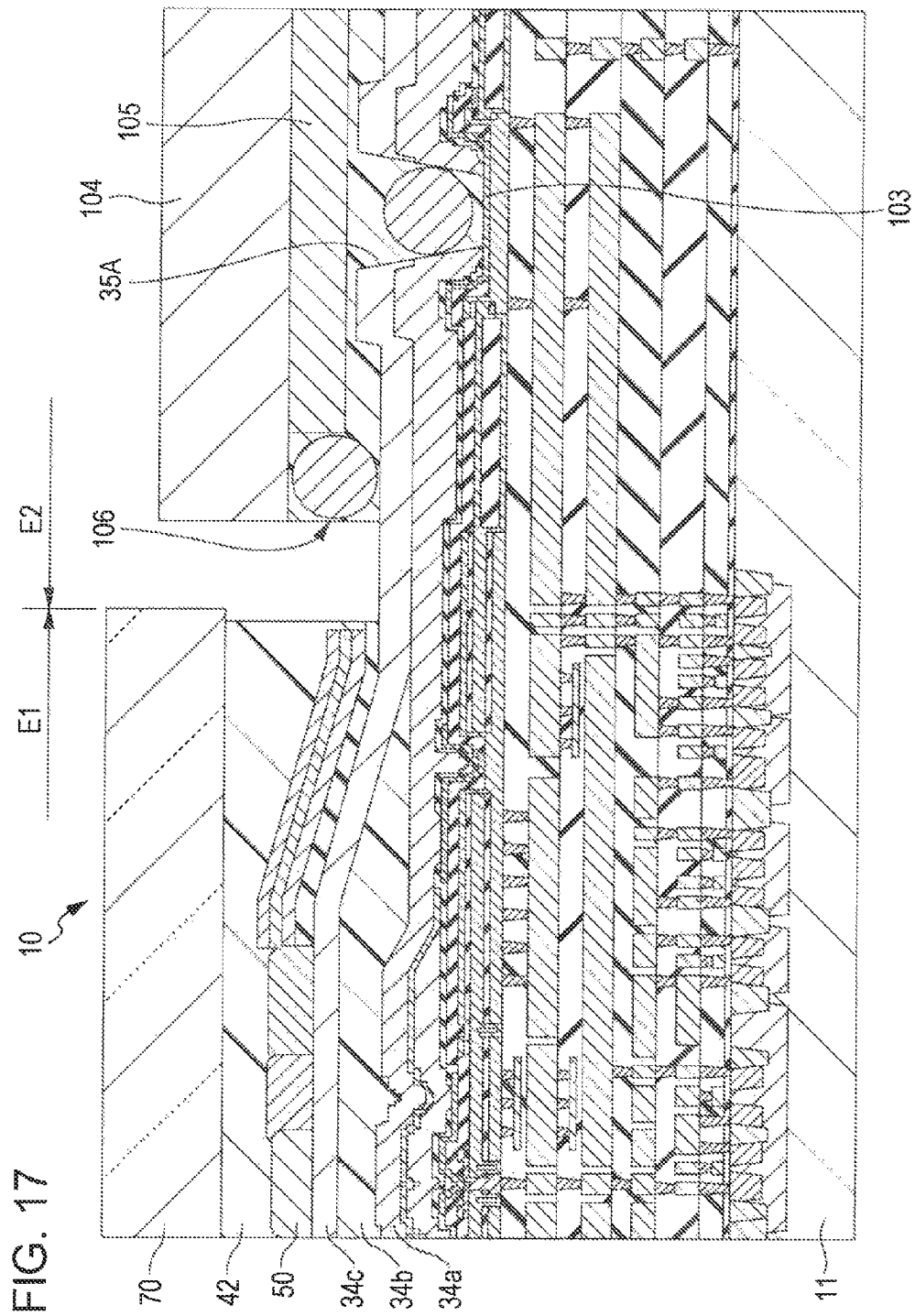
FIG. 17 is a process view that shows the manufacturing method of the organic EL device.
Figure 18:
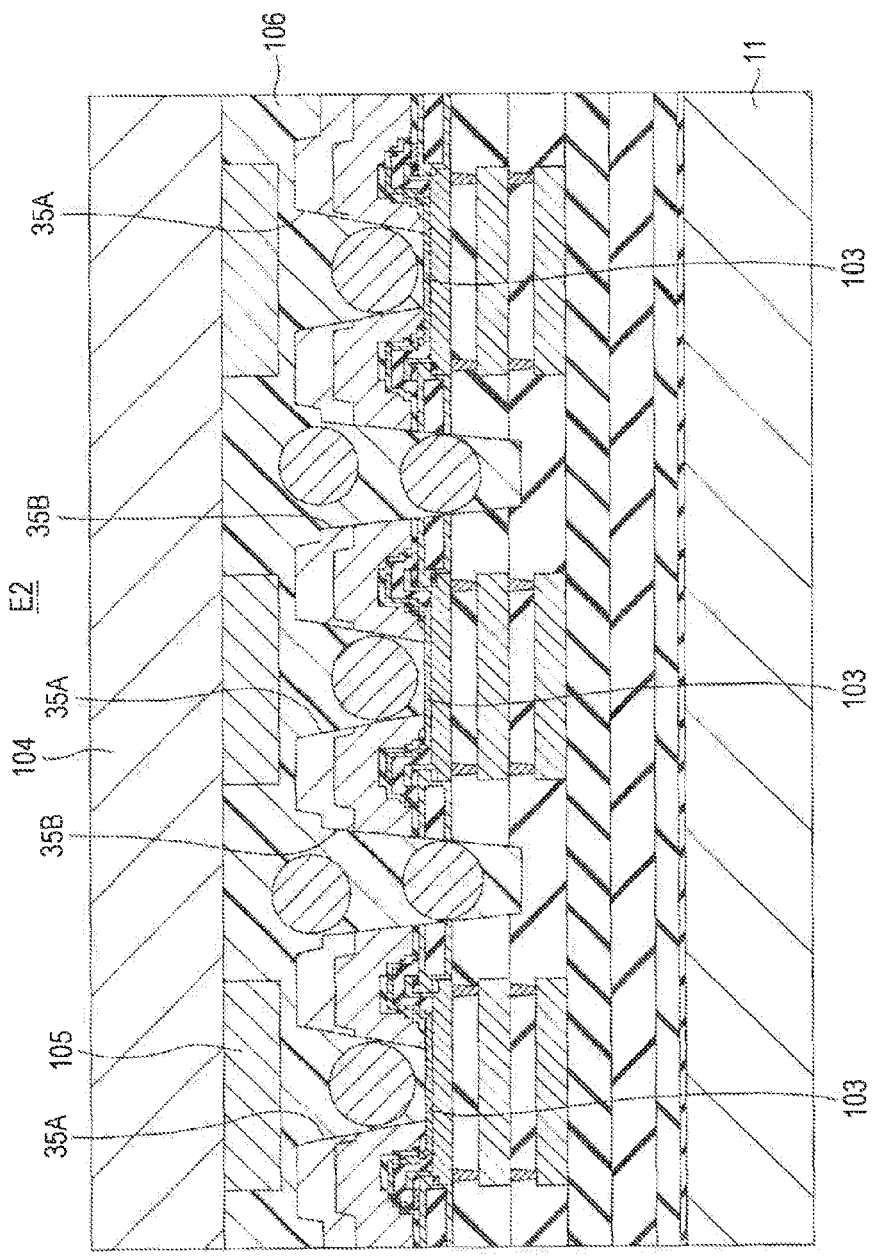
FIG. 18 is a process view that shows the manufacturing method of the organic EL device.

As shown in FIGS. 17 and 18, after the outer surface of the second sealing film 34c of the element substrate 10 is exposed in the above-mentioned processes, the external connection substrate 104 is bonded and fixed to the terminal region E2 of the element substrate 10 using the anisotropic conductive film 106. As a result of this, the mounting terminals 103 of the element substrate 10 side and the connection terminals 105 of the external connection substrate 104 are electrically connected to via the anisotropic conductive film 106 inside the opening holes 35A. In the present embodiment, the inside of the plurality of opening holes 35B is also filled with the anisotropic conductive film 106. Since the depth of the opening holes 35B is greater than that of the opening holes 35A, the opening holes 35B are filled with more anisotropic conductive film 106 than the opening holes 35A.

In this manner, the organic EL device 100 is completed.

In the organic EL device 100, in the terminal region E2 of the element substrate 10, regions between the mounting terminal 103 contribute greatly to the joining strength of the external connection substrate 104. In other words, when the adhesiveness of the regions between the mounting terminals 103 is weak, the external connection substrate 104 becomes separated from the element substrate 10. In a case of a configuration in which the mounting terminals 103 are formed using the same film configuration as the pixel circuits 110, there is a problem in that it is easy for peeling of the external connection substrate 104 to occur in regions between the mounting terminals 103. More specifically, after the external connection substrate 104 is mounted, it is easy for detachment to occur at an interface between the first sealing film 34a, which is formed in order to improve the sealing property of the element substrate 10, and the pixel separation layer 38, which is more toward the lower layer side than the first sealing film 34a. The outer surface of the pixel separation layer 38 becomes unstable as a result of organic contamination due to an etching liquid, or the like, in a formation process of the organic EL elements 30, and the adhesiveness of the first sealing film 34a, which is stacked on the pixel separation layer 38, is weakened. In particular, among the regions of the terminal region E2, the load that accompanies mounting of the external connection substrate 104 is large in the regions that the external connection substrate 104 face, and therefore, it is easy for interface detachment to occur.

In contrast to this, in the present embodiment, a configuration in which the stacked structure, in which it is easy for interface detachment to occur, is removed after bonding of the external connection substrate 104 by forming the plurality of opening holes 35B in the regions between the mounting terminals 103 of the element substrate 10, is used. By selectively reducing the constituent elements that lead to peeling of the external connection substrate 104 in advance, it is possible to improve the joining strength of the external connection substrate 104.

In addition, as a result of providing the plurality of opening holes 35B on the outermost surface of the element substrate 10, the surface area that is in contact with the anisotropic conductive film 106 is increased, and therefore, it is possible to improve the adhesiveness of the external connection substrate 104 with respect to the element substrate 10. In the present embodiment, the recessed sections that configure the opening holes 35B were dug down up to the insulation film of the circuit layer 5 but the invention is not limited to this configuration. Since it is easy for detachment to occur at the interface between the pixel separation layer 38 and the first sealing film 34a, it is also possible to only remove a predetermined region of the first sealing film 34a and the second sealing film 34c. However, digging down up to an insulation film having a large film thickness by removing a portion in which multiple thin films are stacked can improve the joining strength of the external connection substrate 104.

Additionally, in a practical sense, since a film that functions as an etching stop in the manner of the mounting terminals 103, is not present on an opening hole 35B side, etching is performed up to the insulation film of the circuit layer 5.

In addition, film stress of the first sealing film 34a and the second sealing film 34c is reduced by providing the opening holes 35B, and therefore, it is difficult for a circumstance that decreases the joining strength of the external connection substrate 104 to occur. Therefore, it is possible to maintain a fixed state of the external connection substrate 104 for a long period of time.

Additionally, in the manufacturing method of the present embodiment, etching of the first sealing film 34a and the second sealing film 34c is performed with the insulation layer 43 as a mask, but a resist mask may be formed using the same material as the color filters 50. For example, a resist pattern may be formed in the terminal region E2 using a photosensitive resin layer when forming the color filters 50, and etching of the first sealing film 34a and the second sealing film 34c may be performed with the corresponding resist pattern as a mask.

Electronic Apparatus

Next, an embodiment of an electronic apparatus according to the invention will be described.

Figure 19:
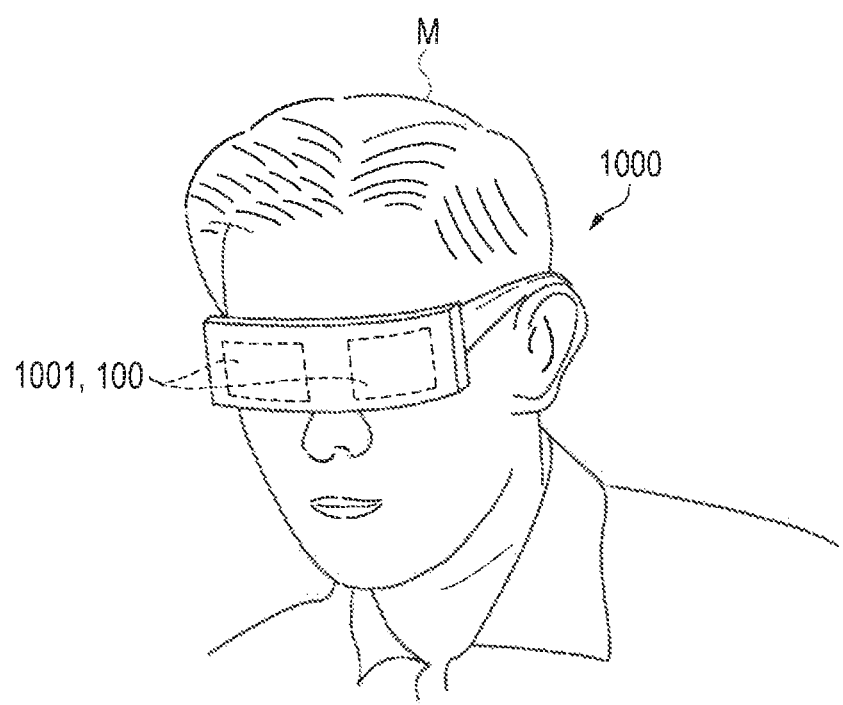
FIG. 19 is a schematic view that shows a head mounted display (HMD) as an electronic apparatus.

FIG. 19 is a schematic view that shows a head mounted display (HMD) as an electronic apparatus.

As shown in FIG. 19, a head mounted display (electronic apparatus) 1000 as an electronic apparatus of the present embodiment, includes two display sections 1001, which are provided to correspond to left and right eyes. An observer M can view characters, images, or the like that are displayed on the display sections 1001 by wearing the head mounted display 1000 on a head portion in the manner of glasses. For example, if images that take parallax into consideration are displayed on the left and right display sections 1001, it is possible to enjoy a three-dimensional video.

The organic EL device 100 of the above-mentioned embodiment is installed in the display sections 1001. Accordingly, since the organic EL device 100 has excellent display quality and has high productivity, it is possible to provide a compact, lightweight head mounted display 1000 having excellent cost performance.

The head mounted display 1000 is not limited to having two display sections 1001, and may have a configuration that is provided with a single display section 1001 that corresponds to either left or right.

Additionally, the electronic apparatus in which the above-mentioned organic EL device 100 is installed is not limited to the head mounted display 1000. Examples include an electronic apparatus that includes a display section of a personal computer or portable digital assistant, a navigator, a viewer, a heads-up display, or the like.

Preferred embodiments according to the invention have been described above with reference to the appended drawings, but naturally, the invention is not limited to these examples. It is clear to persons skilled in the art that various altered examples and corrected example could be conceived if within the range of the technical idea that is set forth in the claims, and it is understood that such examples naturally belong to the technical scope of the invention.

MODIFICATION EXAMPLES

For example, in the above-mentioned embodiment, the organic EL device 100 that used the color filters 50 in order to represent the colors of red (R), green (G), and blue (B), is described, but the embodiment is not limited to this. For example, the invention can be applied to an organic EL device having an RGB painting system that uses organic EL elements 30, in which emitted light of three source colors (R, G, and B) is set, a color conversion system that obtains red (R) and green (G) emitted light as a result of passing through a fluorescent color conversion layer from blue (B) emitted light, or the like, or another multi-color representation method.

The entire disclosure of Japanese Patent Application No. 2016-026011, filed Feb. 25, 2016 is expressly incorporated by reference herein.

What is claimed is:

1. An electro-optical device comprising:
an element substrate that includes a display region in which a plurality of light emitting elements are arranged in matrix form, and a terminal region in which a plurality of mounting terminals are arranged on an outer side of the display region;
a protective substrate that faces a plurality of light emitting element side of the element substrate;
an external connection substrate that is joined to the terminal region of the element substrate; and
a sealing film, which seals the plurality of light emitting elements, that is formed in the terminal region on the element substrate,
wherein at least a part of each mounting terminal is exposed from the sealing film, and
among portions of the terminal region, other than portions that are on the mounting terminals, portions without the sealing film are present in regions that face the external connection substrate.

2. The electro-optical device according to claim 1, wherein the portions without the sealing film are present between the plurality of mounting terminals.

3. The electro-optical device according to claim 1, wherein the portions without the sealing film are present on a display region side of the mounting terminals.

4. The electro-optical device according to claim 1,
wherein at least a part of an interlayer insulation film, which is provided more toward a lower layer side than the sealing film, is exposed in the portions without the sealing film.

5. An electro-optical device comprising:
an element substrate that includes a display region in which a plurality of light emitting elements are arranged in matrix form, and a terminal region in which a mounting terminal is arranged on an outer side of the display region;
a protective substrate that faces a plurality of light emitting element side of the element substrate;
a joining substrate that is joined to the terminal region of the element substrate, and includes a connection terminal that is connected to the mounting terminal; and
a sealing film, which seals the plurality of light emitting elements, that is formed in the terminal region on the element substrate,
wherein the sealing film is removed from portions of the terminal region which join the joining substrate.

6. The electro-optical device according to claim 5,
wherein a plurality of the mounting terminals are provided in the terminal region, and
the portions are between the plurality of mounting terminals.

7. The electro-optical device according to claim 5,
wherein the portions are on a display region side of the mounting terminal.

8. The electro-optical device according to claim 5,
wherein at least a part of an interlayer insulation film, which is provided more toward a lower layer side than the sealing film, is joined to the joining substrate in the portions.

9. An electronic apparatus comprising:
the electro-optical device according to claim 1.

10. An electronic apparatus comprising:
the electro-optical device according to claim 2.

11. An electronic apparatus comprising:
the electro-optical device according to claim 3.

12. An electronic apparatus comprising:
the electro-optical device according to claim 4.

13. An electronic apparatus comprising:
the electro-optical device according to claim 5.

14. An electronic apparatus comprising:
the electro-optical device according to claim 6.

15. An electronic apparatus comprising:
the electro-optical device according to claim 7.

16. An electronic apparatus comprising:
the electro-optical device according to claim 8.

* * * * *